United States Patent [19]

Kameyama et al.

[11] Patent Number: 5,202,277
[45] Date of Patent: Apr. 13, 1993

[54] METHOD OF FABRICATING A SEMICONDUCTOR DEVICE

[75] Inventors: Shuichi Kameyama, Itami; Atsushi Hori; Hiroshi Shimomura, both of Moriguchi; Mizuki Segawa, Hirakata, all of Japan

[73] Assignee: Matsushita Electric Industrial Co., Ltd., Kadoma, Japan

[21] Appl. No.: 918,933

[22] Filed: Jul. 22, 1992

Related U.S. Application Data

[63] Continuation of Ser. No. 621,358, Dec. 3, 1990, abandoned.

[30] Foreign Application Priority Data

Dec. 8, 1989 [JP] Japan .................................. 1-319692
Feb. 8, 1990 [JP] Japan .................................. 2-31158

[51] Int. Cl.$^5$ ............................................ H01L 21/265
[52] U.S. Cl. ......................................... 437/41; 437/44; 437/45; 257/327
[58] Field of Search ..................... 437/40, 41, 44, 45; 357/23.3

[56] References Cited

U.S. PATENT DOCUMENTS

| | | | |
|---|---|---|---|
| 4,907,048 | 3/1990 | Huang | 357/23.3 |
| 4,957,878 | 9/1990 | Lowrey et al. | 437/44 |
| 4,971,922 | 1/1990 | Watabe et al. | 437/44 |
| 5,008,211 | 4/1991 | Yamazaki | 437/41 |
| 5,032,535 | 7/1991 | Kamijo et al. | 437/44 |
| 5,045,486 | 9/1991 | Chittipeddi et al. | 437/41 |
| 5,053,849 | 10/1991 | Izawa | 437/41 |
| 5,061,647 | 10/1991 | Roth et al. | 437/44 |

FOREIGN PATENT DOCUMENTS

| | | | |
|---|---|---|---|
| 1-37852 | 2/1989 | Japan | 437/44 |
| 1-220438 | 9/1989 | Japan | 437/41 |
| 2-52437 | 2/1990 | Japan | 437/44 |
| 2-90536 | 3/1990 | Japan | 437/41 |

OTHER PUBLICATIONS

R. Izawa et al, The Impact of Gate-Drain Overlapped LDD (Gold) for Deep Submicron VLSI's, "International Electron Device Meeting Tech. Digest Papers", pp. 38-41 (1987).

Tiao-yuan Huang et al, A Novel Submicron LDD Transistor with Inverse-T Gate Structure, "International Electron Device Meeting Tech. Dig. Papers", pp. 742-745 (1986).

Primary Examiner—Brian E. Hearn
Assistant Examiner—Kevin M. Picardat
Attorney, Agent, or Firm—Ratner & Prestia

[57] ABSTRACT

A method of fabricating a semiconductor device having gate-drain overlap MOSFETs in which side surfaces of upper portions of gate lines are anisotropically etched using a buffer film as an etch stop is disclosed. An insulating film as a gate insulator is formed on a semiconductor layer of a first conductivity type. A first conductive film is formed on the gate insulator. A buffer film having openings in gate line regions is formed on the first conductive film. A second conductive film is formed on the buffer film. The second conductive film is patterned into wiring shape to form upper portions of gate lines covering the openings of the buffer film. Ions of a second conductivity type are implanted into the semiconductor layer using the upper portions of the gate lines as an implant mask to form sources and drains in the semiconductor layer. Sidewall spacers are formed on the sides of the upper portions of the gate lines. The buffer film and the first conductive film are etched using the upper portions of the gate lines and the sidewall spacers as an etching mask to form under portions of the gate lines.

25 Claims, 23 Drawing Sheets

METHOD OF FABRICATING A SEMICONDUCTOR DEVICE

This application is a continuation of application Ser. No. 07/621,358 filed on Dec. 3, 1990, now abandoned.

BACKGROUND OF THE INVENTION

1. Field of the Invention

This invention relates to a method of fabricating a semiconductor device, more particularly to a method of fabricating a field effect transistor having a gate-drain overlap structure.

2. Description of the Prior Art

The size of semiconductor devices, for example, MOS-type field effect transistors (MOSFETs) constituting integrated circuits (ICs) is becoming smaller and smaller. For miniaturizing the dimension of MOSFETs and other devices, many kinds of device structures and methods of fabricating these devices have been proposed. The reduction of device dimensions has allowed improvements of device performance as well as an increase in the number of devices. However, the supply voltages have not been scaled down with the device dimension due to the system constrains that require an IC to interface with many ICs that need to run at the same voltages. Therefore, miniaturizing the dimension of the MOSFETs increased the internal electric field in the MOSFETs, and this result in reliability problems due to effects such as a short channel effect and a hot carrier effect.

A GOLD (a gate-drain overlapped LDD) structure has been proposed to achieve high reliability and high performance in deep submicron MOSFET (Izawa et. al., International Electron Device Meeting Technical Digest of Papers, pp. 38–41, 1987). According to the GOLD structure, the internal electric field at the edge part of the drain can be reduced.

Referring to FIGS. 12A to 12D, we will describe the prior art method of fabricating the GOLD MOSFET. As shown in FIG. 12A, a gate oxide film 112, a thin lower polycrystalline silicon film (poly-Si film) 120, a thick upper poly-Si film 150 and a silicon oxide layer 160 are sequentially formed on a p-type single crystalline silicon semiconductor layer 100. In these steps, before depositing the thick upper poly-Si film 150 on the thin lower poly-Si film 120, a thin native oxide film which is formed on the surface of the thin lower poly-Si film 120 is not removed. This leads to the presence of the native oxide film (not shown) having a thickness of 0.5 to 1 nm at the interface between the poly-Si film 150 and the poly-Si film 120.

A resist pattern 170 is then formed by conventional photolithography steps. As shown in FIG. 12B, after forming an oxide film pattern 160A using the resist pattern 170 as an etching mask, by further using this oxide film pattern 160A as an etching mask, the thick upper poly-Si film 150 is isotropically etched using a highly selective dry etching technique to form a poly-Si film pattern 150A. In this etching step, the thin native oxide film on the surface of the poly-Si film 120 serves as an etch stop.

Using the oxide film pattern 160A and poly-Si film pattern 150A as an implant mask, phosphorus ions are implanted into the semiconductor layer 100 to form n-type semiconductor regions 200A and 200B in the p-type semiconductor layer 100.

After the ion implant, as shown in FIG. 12C, silicon oxide films (sidewall spacers) 210A and 210B are selectively formed on the side surfaces of oxide film pattern 160A and poly-Si film pattern 150A using an anisotropic etching technique. The thin poly-Si film 120 is then selectively etched to form a wider poly-Si film pattern 120A (which acts as an overlapped gate) using the oxide films 210A and 210B as an etching mask.

Finally, as shown in FIG. 12D, using the silicon oxide films 210A and 210B and oxide film pattern 160A as an implant mask, arsenic ions with high doses are implanted into the semiconductor layer 100 to form n-type semiconductor regions 220A and 220B in the p-type semiconductor layer 100.

In the GOLD MOSFET, the n-type semiconductor region 200B at the end part (edge) of the drain is sufficiently overlapping (more than 0.2 $\mu$m) the poly-Si pattern 120A. Due to this overlap (gate-drain overlap), the peak electric field at the drain end part is reduced as compared with that of other MOSFETs, for example, MOSFETs having a conventional LDD (lightly doped drain) structure. Thus, generation of hot carriers at the drain end part of the GOLD MOSFET is suppressed.

However, the conventional method of fabricating a GOLD MOSFET has the following disadvantages.

(1) Since a thin native oxide film is used as an etch stop in the step of etching the poly-Si film 150, it is necessary to use an etchant which has an etch selectivity (ratio of the etch rate of the poly-Si film relative to that of the native oxide film) of several hundreds, so as not to etch the thin native oxide film and poly-Si film 120. However, such an etchant having an etch selectivity of several hundreds isotropically etches the side surfaces of the poly-Si film pattern 150A, as shown in FIG. 12B. Therefore, the width of the upper poly-Si film pattern 150A is decreased from the width of the oxide film pattern 160A, and the resistance of the gate line is increased.

(2) Due to the side-etch of the poly-Si film pattern 150A as shown in FIG. 12B, the oxide film pattern 160A overhangs. This overhanging deteriorates the features (shapes) of the oxide films 210A and 210B left on the side surfaces of the poly-Si pattern 150A. Since these oxide film (sidewall spacers) 210A and 210B are used as an etching mask for etching the poly-Si film 120, variations in the features of the oxide film 210A and 210B lead to variations in the width of the poly-Si film 120A (gate length of the MOSFET).

(3) Presence of the native oxide film (0.5 to 1.0 nm thick) between the upper poly-Si film 150 and lower poly-Si film 120A results in a high electrical resistance of contacts between the poly-Si film pattern 150A and the poly-Si film pattern 120A.

SUMMARY OF THE INVENTION

According to the invention, a method of fabricating a semiconductor device having MOSFETs is provided, which overcomes the above-discussed and numerous other disadvantages and deficiencies of the prior art, the method comprising the steps of: forming an insulating film as a gate insulator on a semiconductor layer of a first conductivity type; forming a first conductive film on said insulating film; forming a buffer film on said first conductive film, said buffer film having openings in gate line regions of said buffer film; forming a second conductive film on said buffer film; patterning said second conductive film into wiring shape to form upper portions of gate lines of said MOSFETs, said upper portions covering said openings of said buffer film; implanting ions of a second conductivity type into said semiconductor layer using said upper portions of said gate lines as an implant mask to form sources and drains in said semiconductor layer; forming sidewall spacers on the sides of said upper portions of said gate lines; etching said buffer film using said upper portions of said gate lines and said sidewall spacers as an etching mask; and etching said first conductive film using said upper portions of said gate lines and said side spacers as an etching mask, thereby forming under portions of said gate lines.

In a preferred embodiment, the first conductive film is made of semiconductor and said steps of forming said buffer film on said conductive film comprises the steps of: forming an oxidation resistant layer which defines the surface locations of said openings on said first conductive film; oxidizing selectively exposed surface of said first conductive film, using said oxidation resistant layer as a mask, to form said buffer film, said buffer film being made of semiconductor oxide; and removing said oxidation resist layer to form said openings in said buffer film.

In a preferred embodiment, said second conductive film are made of material selected from the group consisting of metal and metal compound.

In a preferred embodiment, said method further comprising the step of: implanting ions of a second conductivity type into said semiconductor layer using said upper portions of said gate lines and said sidewall spacers as an implant mask to reduce a resistance of said sources and drains.

In a preferred embodiment, said first conductive film is made of semiconductor and said method further comprises the steps of: diffusing dopants into said second conductive film; and diffusing said dopants into said first conductive film from said second conductive film through said openings of said buffer film to reduce conductivity of said first conductive film.

In a preferred embodiment, said buffer film are made of conductive material.

In a preferred embodiment, said sidewall spacers are made of conductive material.

In a preferred embodiment, said openings of said buffer film are formed just above channel regions of said MOSFETs.

In a preferred embodiment, said step of implanting said ions of a second conductivity type into said semiconductor layer comprises a step of implanting said ions into said semiconductor layer using an oblique ion implantation method.

According to the invention, a method of fabricating a semiconductor device having MOSFETs is provided, comprising the steps of: forming an insulating film as a gate insulator on a semiconductor layer of a first conductivity type; forming a first conductive film on said insulating film; forming a buffer film on said first conductive film, said buffer film having openings in gate line regions of said buffer film; forming a second conductive film on said buffer film; patterning said second conductive film into wiring shapes to form upper portions of gate lines of said MOSFETs, said upper portions covering said openings of said buffer film; forming on said buffer layer an implant mask layer to cover source regions of said semiconductor layer; implanting ions of a second conductivity type into said semiconductor layer using said upper portions of said gate lines and said mask layer as an implant mask to form drains in said semiconductor layer; removing said mask layer from said buffer layer; forming sidewall spacers on the sides of said upper portions of said gate lines; and etching said buffer film using said upper portions of said gate lines and said sidewall spacers as an etching mask; etching said first conductive film using said upper portions of said gate lines and said sidewall spacers as an etching mask, thereby forming under portions of said gate lines; and implanting ions of a second conductivity type into said semiconductor layer using said upper portions of said gate lines and said sidewall spacers as an implant mask to form sources in said semiconductor layer and to reduce the resistance of said drains.

According to the invention, a method of fabricating a semiconductor device having MOSFETs is provided, comprising the steps of: forming an insulating film on a semiconductor layer of a first conductivity type; forming a first conductive film on said insulating film; forming a buffer film on said first conductive film, said buffer film having openings in gate line regions of said buffer film; forming a second conductive film on said buffer film; patterning said second conductive film into wiring shapes to form upper portions of said gate lines; implanting ions of a second conductivity type into said semiconductor layer using said upper portions of said gate lines as an implant mask to form sources and drains in said semiconductor layer, said ions are implanted into said semiconductor layer in an oblique direction; etching said buffer film using said upper portions of said gate lines as an etching mask; and etching said first conductive film using said upper portions of said gate lines as an etching mask, thereby forming under portions of said gate lines.

In a preferred embodiment, said first conductive film is made of semiconductor and said steps of forming said buffer film on said conductive film comprises the steps of: forming an oxidation resistant layer which defines the surface locations of said openings on said first conductive film; oxidizing selectively exposed surface of said first conductive film, using said oxidation resistant layer as a mask, to form said buffer film, said buffer film being made of semiconductor oxide; and removing said oxidation resist layer to form said openings in said buffer film.

In a preferred embodiment, said second conductive film is made of material selected from the group consisting of metal and metal compound.

In a preferred embodiment, said method further comprises the step of: implanting ions of a second conductivity type into said semiconductor layer using said upper portions of said gate lines as an implant mask to reduce resistance of said sources and drains.

In a preferred embodiment, said first conductive film is made of semiconductor and said method further comprises the steps of: diffusing dopants into said second conductive film; and diffusing said dopants into said first conductive film from said second conductive film through said openings of said buffer film to reduce conductivity of said first conductive film.

In a preferred embodiment, said buffer film is made of conductive material.

In a preferred embodiment, said openings of said buffer film are formed just above channel regions of said MOSFETs.

According to the invention, a method of fabricating a semiconductor device having MOSFETs is provided, comprising the steps of: forming an insulating film on a semiconductor layer of a first conductivity type; forming a first conductive film on said insulating film; forming a buffer film on said first conductive film, said buffer film having openings in gate line regions of said buffer film; forming a second conductive film on said buffer film; patterning said second conductive film into wiring shapes to form upper portions of said gate lines; implanting ions of a second conductivity type into said semiconductor layer using said upper portions of said gate lines as an implant mask to form sources and drains in said semiconductor layer; removing said buffer film from said first conductive film; forming sidewall spacers on the sides of said upper portions of said gate lines; and etching said first conductive film using said upper portions of said gate lines and said side spacers as an etching mask, thereby forming under portions of said gate lines.

In a preferred embodiment, said first conductive film is made of semiconductor and said steps of forming said buffer film on said conductive film comprises the steps of: forming an oxidation resistant layer which defines the surface locations of said openings on said first conductive film; oxidizing selectively exposed surface of said first conductive film, using said oxidation resistant layer as a mask, to form said buffer film, said buffer film being made of semiconductor oxide; and removing said oxidation resist layer to form said openings in said buffer film.

In a preferred embodiment, said second conductive film is made of material selected from the group consisting of metal and metal compounds.

In a preferred embodiment, said method further comprises the step of: implanting ions of a second conductivity type into said semiconductor layer using said upper portions of said gate lines and said sidewall spacers as an implant mask to reduce the resistance of said sources and drains.

In a preferred embodiment, said first conductive film is made of semiconductor and said method further comprises the steps of: diffusing dopants into said second conductive film; and diffusing said dopants into said first conductive film from said second conductive film through said openings of said buffer film to reduce conductivity of said first conductive film.

In a preferred embodiment, said sidewall spacers are made of conductive material.

In a preferred embodiment, said openings of said buffer film are formed just above channel regions of said MOSFETs.

In a preferred embodiment, said step of implanting ions of a second conductivity type into said semiconductor layer comprises a step of implanting said ions into said semiconductor layer using an oblique ion implantation method.

Thus, the invention described herein makes possible the objectives of: (1) providing a method of fabricating a semiconductor device in which an etchant having a high etch selectivity is not required in the step of forming the upper portion of the gate line of a MOSFET having a gate-drain overlap structure; and (2) providing a method of fabricating a semiconductor device in which the side surfaces of the upper portion of the gate line of the MOSFET are anisotropically etched.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1A:
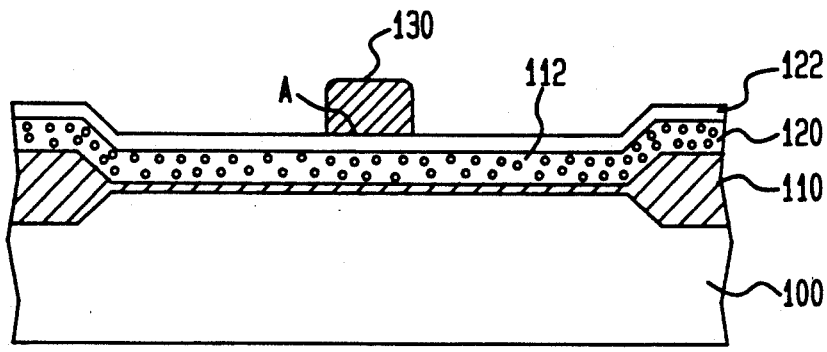
FIGS. 1A to 1G are cross sectional views illustrating the steps of fabricating an n-channel MOSFET according to a first embodiment of the invention.

Referring to FIGS. 1A to 1G which illustrate the steps of fabricating an n-channel MOSFET, we will describe a first embodiment of the invention. In this embodiment, as shown in FIG. 1A, a p-type single crystalline silicon semiconductor layer 100 was provided with an oxide layer (about 500 nm thick) 110 for element isolation and an element region surrounded by the oxide layer 110. A gate oxide layer (about 10 to 30 nm thick) 112 as a first insulating film, a poly-Si film (about 100 to 150 nm thick) 120 as a first conductive film, and a silicon nitride film (about 40 nm thick) 122 were successively formed over the semiconductor layer 100 and the oxide layer 110. A resist pattern 130 which defines the pattern of openings to be formed in the silicon oxide film 140 (FIG. 1B) was photolithographically formed on the silicon nitride film 122. In practice, a semiconductor device contains a large number of such isolated element regions. However, only one such region is shown in the Figures for the sake of simplicity.

Figure 1B:
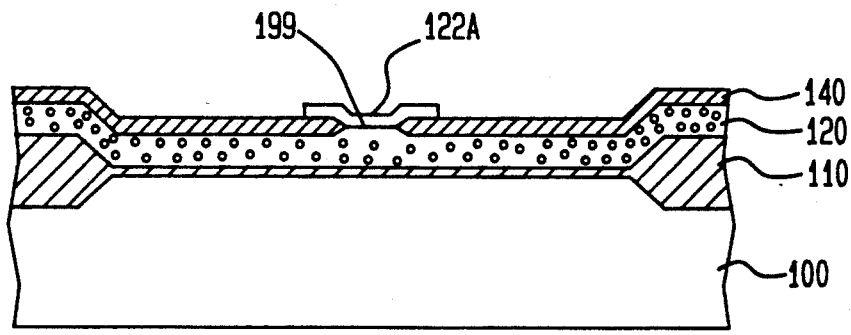

The silicon nitride film 122 was etched to expose the poly-Si film 120 using the resist pattern 130 as an etching mask. The resist pattern 130 was then removed leaving the silicon nitride pattern 122A in the gate line region. The resist pattern 130 has a width of 0.6 to 0.8 $\mu$m and serves as an oxidation resistant layer. Then, as shown in FIG. 1B, the surface of the poly-Si film 120 was selectively oxidized to form a silicon oxide film 140 which functions as a buffer film.

Figure 1C:
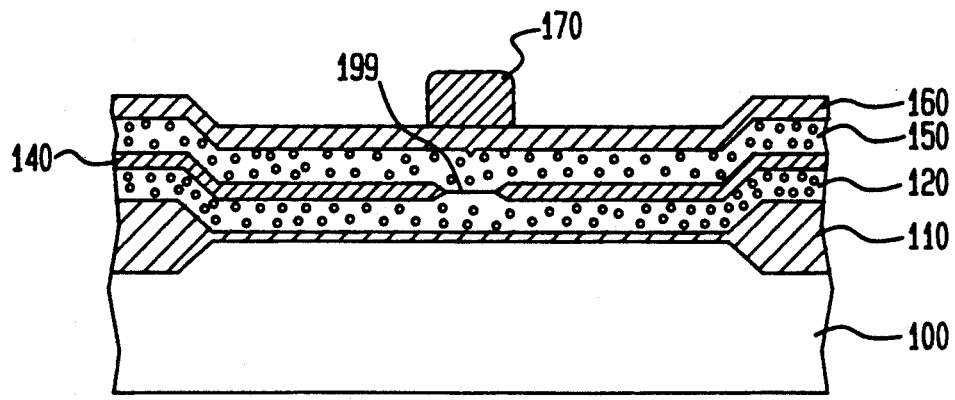

The silicon nitride pattern 122A was then removed to form an opening (200 to 300 nm width) 199 in the silicon oxide film 140. A poly-Si film (200 to 300 nm thick) 150 as a second conductive film and a silicon oxide film (about 200 nm thick) 160 were successively deposited over the silicon oxide film 140. As shown in FIG. 1C, the poly-Si film 150 contacted the poly-Si film 120 through the opening 199 in the silicon oxide film 140.

In order to reduce the resistivity of the poly-Si films 120 and 150, diffusion of dopants into the poly-Si films 120 and 150 was conducted. A buffer film (silicon oxide film) 140 obtained by oxidizing a heavily doped poly-Si film has properties that permits pinholes to be formed, it also has a higher etch rate. From the standpoint of quality of the buffer film (the silicon oxide film) 140, therefore, dopant concentration of the poly-Si film 120 should be sufficiently low during the step of oxidizing the poly-Si film 120. In this embodiment, the step of diffusing dopants into the poly-Si film 120 was conducted after the step of oxidizing the undoped poly-Si film 120. Specifically, after diffusing the dopants into the poly-Si film 150, the dopants in the poly-Si film 150 were diffused into the undoped poly-Si film 120 from the poly-Si film 150 through the opening 199 of the silicon oxide film 140 by a heat treatment.

The resist pattern 170 which defines the gate line region was formed on the silicon oxide film 160 so as to fully cover the opening 199 of the silicon oxide film 140 as shown FIG. 1C. In other words, the resist pattern 170 with a width which is wider than that of the opening 199 in the silicon oxide film 140, is formed on the surface of the silicon oxide film 160. The resist pattern 170 has a width of 0.8 to 1.0 $\mu$m.

Figure 1D:
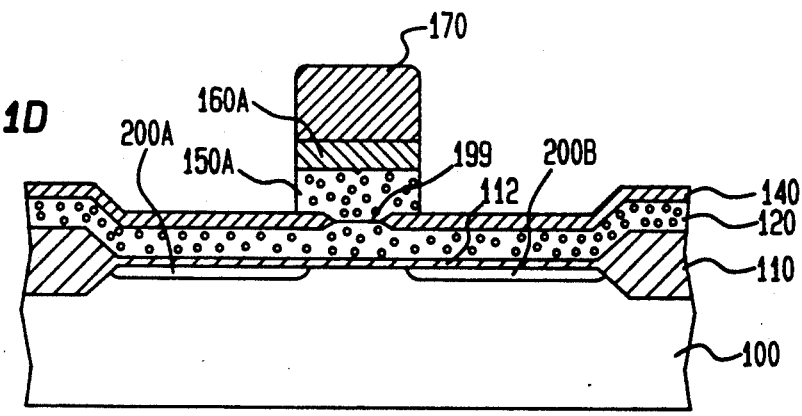

As shown in FIG. 1D, using the resist pattern 170 as an etching mask, the silicon oxide film 160 was anisotropically etched by a reactive ion etching (RIE) technique to form a silicon oxide film pattern 160A of wiring shape, and the poly-Si film 150 was anisotropically etched by an RIE technique to form a poly-Si film pattern 150A (which constitutes the upper portion of the gate line of the MOSFET). In the step of etching the poly-Si film 150, the silicon oxide film (the buffer film) 140 functioned as an etch stop. Since a thick oxide film was used as an etch stop in the step of etching the poly-Si film 150, an etchant having an etch selectivity of several hundreds was not used. Therefore, the side surfaces of the poly-Si film pattern 150A are not isotropically etched, and the width of the poly-Si film pattern 150A was not decreased from the width of the oxide film pattern 160A as shown in FIG. 1D.

Next, using the resist pattern 170 as an implant mask, phosphorus ions were implanted at a low dose through the gate oxide layer 112, poly-Si film 120 and the silicon oxide film 140 into the semiconductor layer 100 to form a first semiconductor region 200A of n-type and a second semiconductor region 200B of n-type in the p-type semiconductor layer 100 (FIG. 1D). The first semiconductor region 200A and the second semiconductor region 200B constitute lightly doped regions of the source and drain.

Figure 1E:
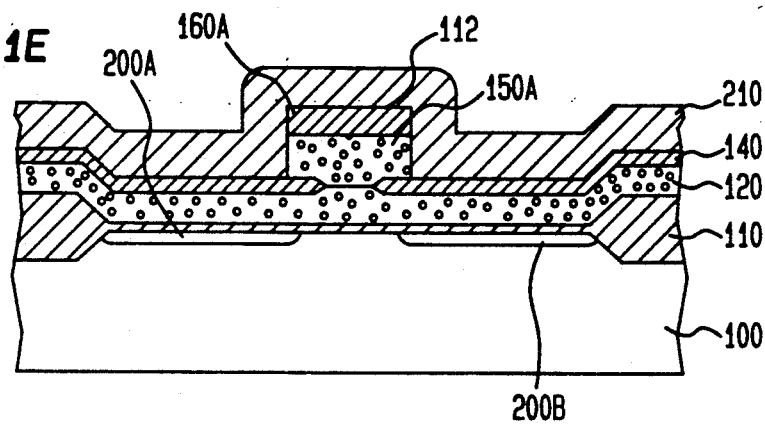

As shown in FIG. 1E, after removing the resist pattern 170 (not shown in FIG. 1E), a silicon oxide film 210 as a second insulating film was deposited on the silicon oxide film 140 to cover the side surfaces of the upper portion of the gate line. Using an anisotropic RIE technique, the silicon oxide film 210 was etched back to expose the surface of the poly-Si film 120. Silicon oxide films (sidewall spacers) 210A and 210B were left on the side surfaces of the patterns 160A and 150A, and silicon oxide films 140A and 140B were left under the silicon oxide films 210A and 210B.

Figure 1F:
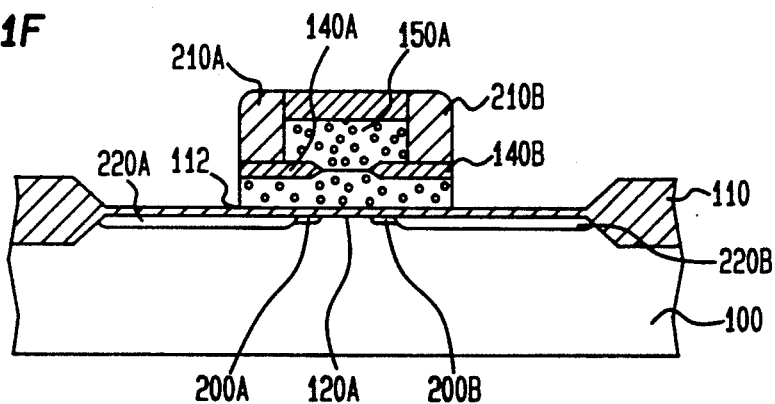

Furthermore, using the upper portion of the gate line, the silicon oxide films 140A and 140B, and the silicon oxide films 210A and 210B as an etching mask, the poly-Si film 120 was etched to form a poly-Si pattern 120A which is the under portion of the gate line of the MOSFET, as shown in FIG. 1F.

By nearly vertical ion implantation method (in which a tilt angle between the normal of the wafer flat and the direction of ion beam is set to be at 10° or less), arsenic ions were implanted into the semiconductor layer 100 at a dose of 2 to $9 \times 10^{15}$ cm$^{-2}$, using the silicon oxide films 210A and 210B and poly-Si film 150A as an implant mask, thereby forming a third semiconductor region 220A of n+-type and a fourth semiconductor region 220B of n+-type in the p-type semiconductor layer 100 as shown in FIG. 1F. The first semiconductor region 200A and the third semiconductor region 220A constitute the source of the MOSFET. The second semiconductor region 200B and the fourth semiconductor region 220B constitute the drain of the MOSFET. The heavily doped regions 220A and 220B reduce the resistance of the source and drain. The lightly doped semiconductor region 200B at the end part of the drain reduces the peak electric field at the end part of the drain.

Figure 1G:
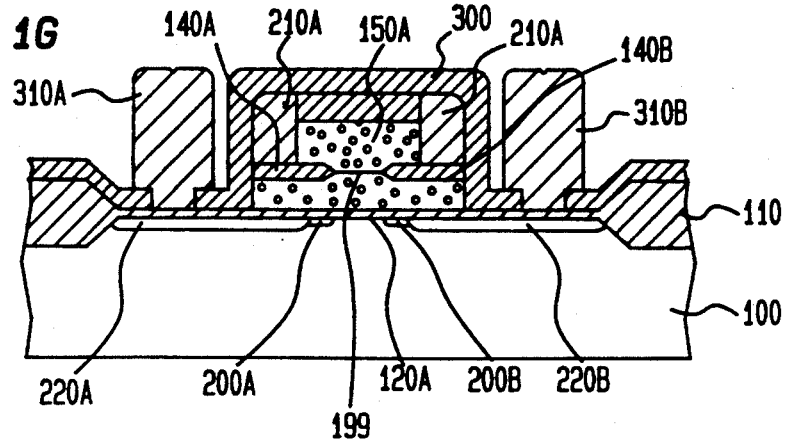

As shown in FIG. 1G, after depositing a silicon oxide film 300 over the entire surface of the semiconductor layer 100, contact windows were formed in the silicon film 300. Then, a source electrode 310A made of aluminum and a drain electrode 310B made of aluminum were formed on the silicon oxide film 300 to contact the source and drain of the MOSFET.

According to this embodiment, the MOSFET can be fabricated with ease which has the n-type semiconductor region 200D at the end of the drain sufficiently overlapping the poly-Si film pattern 120A of the gate line. Owing to this overlap (for example, more than 0.2 $\mu$m overlap), the electric field applied to the drain edge part is reduced as compared with MOSFETs fabricated by the conventional method. Therefore generation of hot carriers at the drain edge part is suppressed, and excellent reliability and long life of the MOSFET are obtained.

In this embodiment, the buffer film 140 which is interposed between the second conductive film 150 and the first conductive film (poly-Si film) 120 is used as an etch stop in the step of etching the second conductive film (poly-Si film) 150, and an electrical interconnection between the second conductive film 150 and the first conductive film 120 is achieved through the openings 199 of the buffer film 140. The buffer film 140 is sufficiently thick enough to serve as an etch stop for a low selective etching, so that etching of the second conductive film 150 can be conducted with ease even under anisotropic dry etching conditions. According to the invention, therefore, an excellent shape of a gate line (or gate electrode) having gate-drain overlap structure is obtained.

Since the second conductive film disposed in the upper layer is etched by anisotropic dry etching, the resulting gate electrode is free from a defective coverage, and has a pattern ensuring an minimum electric resistance with no restricted portions. A major advantage of the fabricating method according to the present invention is that as shown in FIG. 1(c) by removing the silicon nitride pattern 122A the openings 199 are formed in the silicon oxide film 140 which later becomes a buffer film, and after the polysilicon film 150 is formed as the second conductive film, the resist pattern having a width which is wider than that of the opening 199 in the silicon oxide film 140 is formed on the surface of the silicon oxide film 160. According to the conventional MOS method, the resulting resist pattern is small because of the limitation of the production process so that it necessarily requires the openings 199 in the silicon oxide film 140 to be small.

The width of the gate line should be wider than that of the opening 199, so that the process of forming a smaller or narrower opening 199 in the buffer film 140 is necessary in order to minimize the width of the gate line. In this embodiment, the buffer film 140 having the opening 199 was formed by thermally oxidizing the selected area of the surface of the poly-Si film 120. The lateral oxidation (bird's beak) during the selective oxidation of the poly-Si film 120 decreases the size of the opening 199 in the buffer film 140. According to this embodiment, therefore, the opening 199 having a smaller size than that of the narrowest resist pattern which can be formed by a photolithography system was obtained. A thin oxide film may be formed on the poly-Si film 120 before forming the silicon nitride film 122. The thin oxide film increases the length of the bird's beak. By adjusting the thickness of the thin oxide film, the length of the bird's beak is precisely controlled.

The ion implant for forming the third semiconductor region 220A of n+-type and the fourth semiconductor region 220B of n+-type in the p-type semiconductor layer 100 may be conducted before the step of etching the buffer film 142. In this case, the ions are implanted through the buffer film 142 into the p-type semiconductor layer 100 so that the thickness of the third semiconductor region 220A and the fourth semiconductor region 220B are reduced to form shallow junctions.

Example 2

Figure 2A:
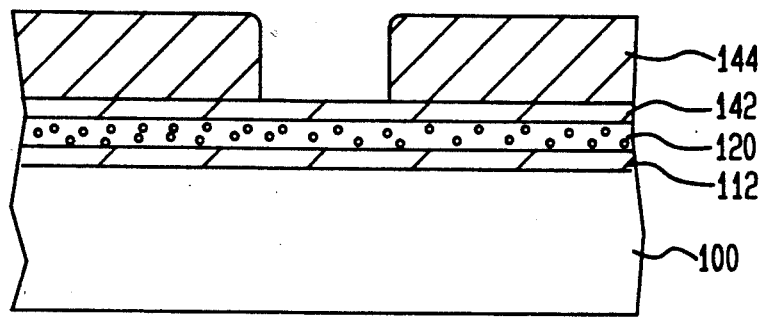
FIGS. 2A to 2E are cross sectional views illustrating the steps of fabricating an n-channel MOSFET according to a second embodiment of the invention.

Referring to FIGS. 2A to 2E which illustrate the steps of fabricating an n-channel MOSFET, we will describe a second embodiment of the invention. In this embodiment, as shown in FIG. 2A, a gate oxide layer (about 10 to 30 nm thick) 112 as a first insulating film, a poly-Si film (about 100 to 150 nm thick) 120 as a first conductive film, and a CVD-silicon oxide film (about 30 to 100 nm thick) 142 were successively formed over on a semiconductor layer 100. A resist pattern 144 which defines the pattern of openings 199 (FIG. 2B) to be formed in the CVD-silicon oxide film 142 was photolithographically formed on the CVD-silicon oxide film 142.

Figure 2B:
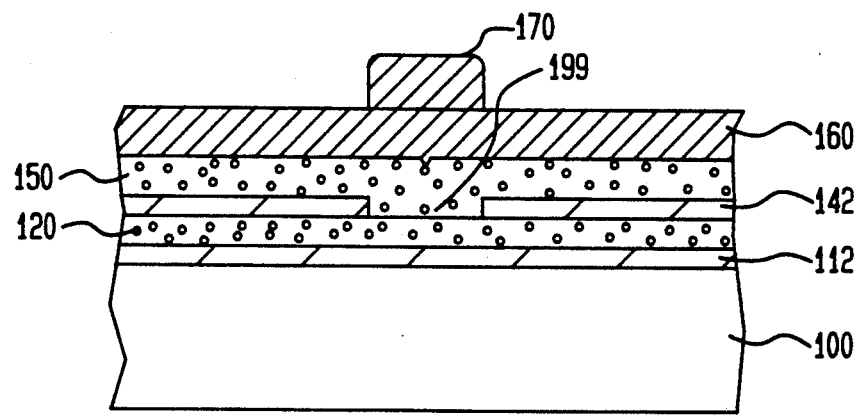

The CVD-silicon oxide film 142 was selectively etched using the resist pattern 144 as an etching mask to form opening 199 in the CVD-silicon oxide film 142. After removing the resist pattern 144, a poly-Si film (200 to 300 nm thick) 150 as a second conductive film and a silicon oxide film (about 200 nm thick) 160 were successively deposited over the CVD-silicon oxide film 142. As shown in FIG. 2B, the poly-Si film 150 contacted the poly-Si film 120 through the opening 199 of the CVD-silicon oxide film 142. In order to reduce the resistivity of the poly-Si films 120 and 150, diffusion of dopants into the poly-Si films 120 and 150 was conducted by the process mentioned in Example 1.

A resist pattern 170 which defines the gate line region was formed on the silicon oxide film 160 so as to fully cover the opening 199 of the CVD-silicon oxide film 142 as shown FIG. 2B. Resist pattern 170, which is formed on the surface of the silicon oxide film 160 has a width which is wider than that of the opening 199 in the CVD-silicon oxide film 142. The resist pattern 170 has a width of 0.8 to 1.0 μm.

Figure 2C:
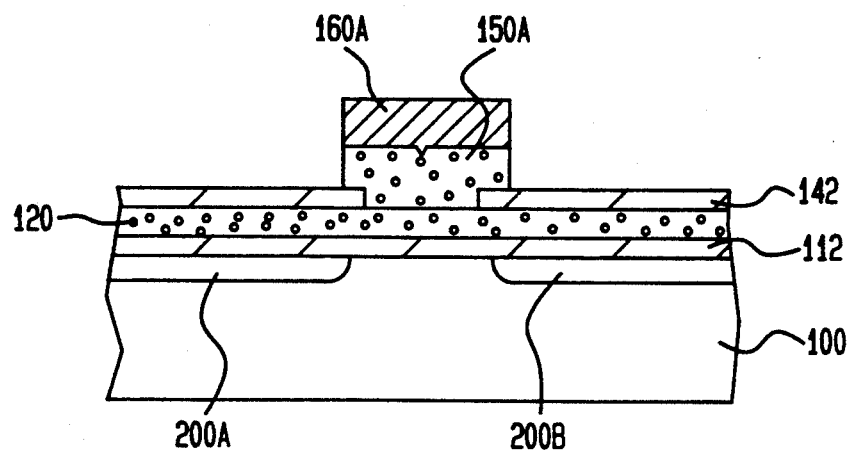

As shown in FIG. 2C, using the resist pattern 170 (not shown in FIG. 2C) as an etching mask, the silicon oxide film 160 was anisotropically etched by an RIE technique to form a silicon oxide film pattern 160A of wiring shape, and the poly-Si film 150 was anisotropically etched by an RIE technique to form a poly-Si film pattern 150A with a width which is wider than that of the opening 199 in the CVD-silicon oxide film 142 (which constitutes the upper portion of the gate line of the MOSFET). In the step of etching the poly-Si film 150, the CVD-silicon oxide film 142 functioned as an etch stop, and it was possible to etch the poly-Si film 150 efficiently and easily even under anisotropic etch conditions.

Next, using the resist pattern 170 (not shown in FIG. 2C) as an implant mask, phosphorus ions were implanted at a low dose through the gate oxide layer 112, poly-Si film 120 and the CVD-silicon oxide film 142 to form a first semiconductor region 200A of n-type and a second semiconductor region 200B of n-type in the p-type semiconductor layer 100 as shown in FIG. 2C.

After depositing a silicon oxide film 210 on the silicon oxide film 140 to cover the side surfaces of the upper portion of the gate line, the silicon oxide film 210 was etched back to expose the surface of the poly-Si film 120 using an anisotropic RIE technique. Silicon oxide films (sidewall spacers) 210A and 210B were left on the side surfaces of the patterns 160A and 150A, and silicon oxide films 142A and 142B were left under the silicon oxide films 210A and 210B.

Figure 2D:
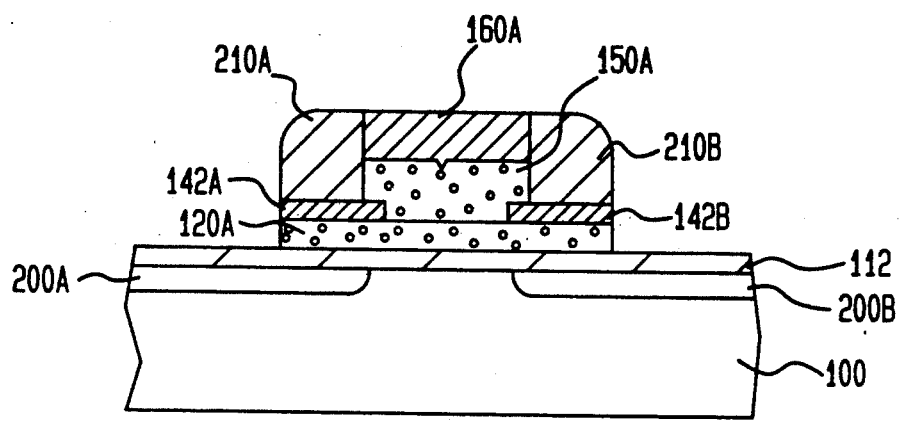
Figure 2E:
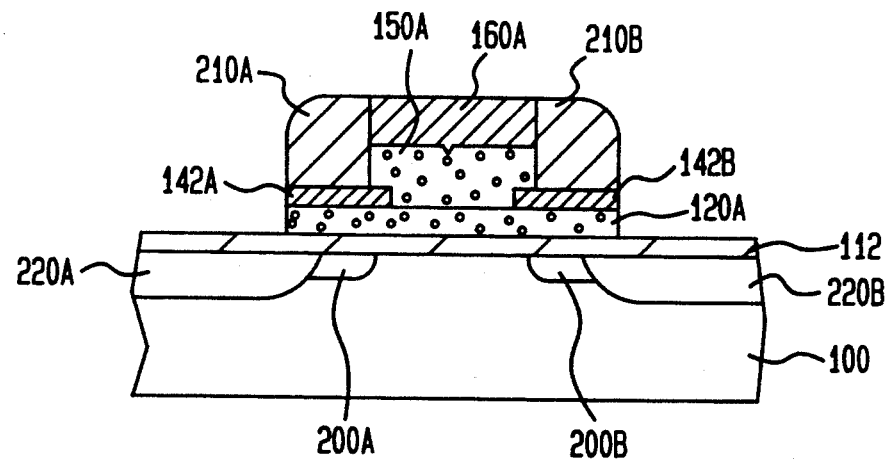

As shown in FIG. 2D, using the upper portion of the gate line, the silicon oxide films 142A and 142B, and the silicon oxide films 210A and 210B as an etching mask, the poly-Si film 120 was etched to form a poly-Si pattern 120A (which is the under portion of the gate line of the MOSFET).

By the nearly vertical ion implantation method, arsenic ions were implanted into the semiconductor layer 100 at a dose of 2 to $9\times10^{15}$ cm$^{-2}$, using the silicon oxide films 210A and 210B and poly-Si film 150A as an implant mask, thereby forming a third semiconductor region 220A of n+-type and a fourth semiconductor region 220B of n+-type in the p-type semiconductor layer 100, as shown in FIG. 2B. The first semiconductor region 200A and the third semiconductor region 220A constitute the source of the MOSFET. The second semiconductor region 200B and the fourth semiconductor region 220B constitute the drain of the MOSFET.

According to this embodiment, the silicon oxide film deposited by a CVD method was used as the buffer film 142. In order to reduce the resistivity of the gate line, a conductive film made of a refractory metal (e.g. tungsten, or titanium silicide) or a refractory metal silicide (e.g. tungsten silicide) may be used as the buffer film 142.

According to this embodiment, it is not required to thermally oxidize the poly-Si film 120 in the step of forming the buffer film 142 on the poly-Si film 120. Therefore, an amorphous silicon film can be used instead of the poly-Si film 120. If the amorphous silicon film is used instead of the poly-Si film 120, the channeling effect of ions is suppressed when phosphorus ions are implanted through the amorphous silicon film into semiconductor layer 100 in order to form the first semiconductor region 200A and the second semiconductor region 200B in the p-type semiconductor layer 100.

Example 3

Figure 3A:
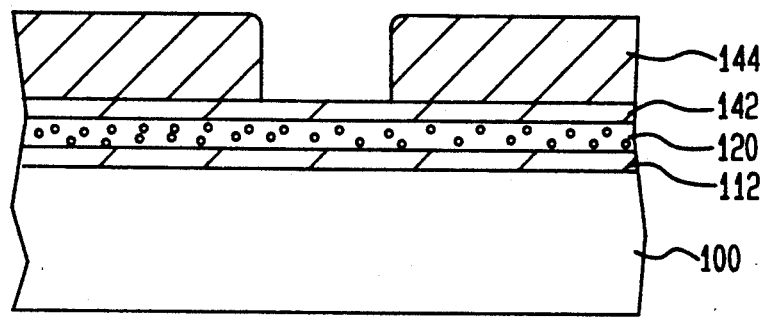
FIGS. 3A to 3E are cross sectional views illustrating the steps of fabricating an n-channel MOSFET according to a third embodiment of the invention.

Referring to FIGS. 3A to 3E which illustrate the steps of fabricating an n-channel MOSFET, we will describe a third embodiment of the invention. In this embodiment, as shown in FIG. 3A, a gate oxide layer (about 10 to 30 nm thick) 112 as a first insulating film, a poly-Si film (about 100 to 150 nm thick) 120 as a first conductive film, and a CVD-silicon oxide film (about 30 to 100 nm thick) 142 were successively formed over a semiconductor layer 100. A resist pattern 144 which defines the pattern of openings 199 (FIG. 3B) to be formed in the CVD-silicon oxide film 142 was photolithographically formed on the CVD-silicon oxide film 142.

Figure 3B:
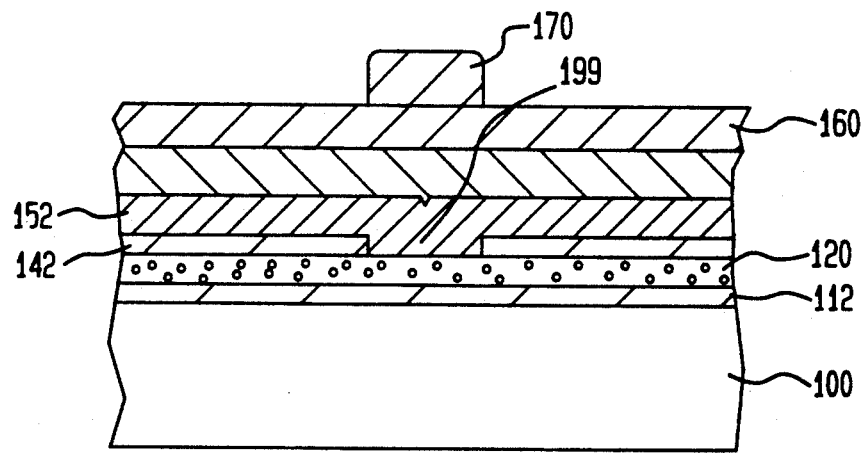

The CVD-silicon oxide film 142 was selectively etched using the resist pattern 144 as an etching mask to form opening 199 in the CVD-silicon oxide film 142. After removing the resist pattern 144, a tungsten silicide film (200 to 300 nm thick) 152 as a second conductive film and a silicon oxide film (about 200 nm thick) 160 were successively deposited over the CVD-silicon oxide film 142. As shown in FIG. 3B, the tungsten silicide film 152 contacted the poly-Si film 152 through the opening 199 of the CVD-silicon oxide film 142. In order to reduce the resistivity of the poly-Si films 120, diffusion of dopants into the poly-Si film 120 was conducted by a similar process to that mentioned in Example 1.

A resist pattern 170 which defines the gate line region was formed on the silicon oxide film 160 so as to fully cover the opening 199 of the silicon oxide film 140 as shown FIG. 3B. Resist pattern 170, which is formed on the surface of the silicon oxide film 160 has a width which is wider than that of the opening 199 in the CVD-silicon oxide film 142. The resist pattern 170 has a width of 0.8 to 1.0 µm.

Figure 3C:
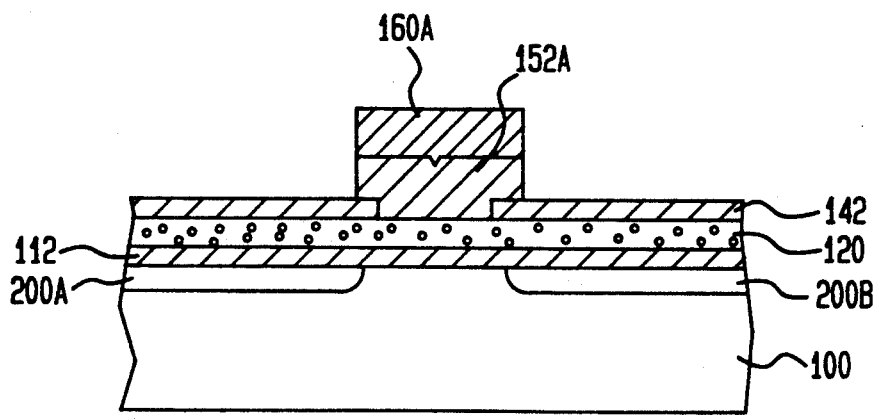

As shown in FIG. 3C, using the resist pattern 170 (not shown in FIG. 3C) as an etching mask, the silicon oxide film 160 was anisotropically etched by a RIE technique to form a silicon oxide film pattern 160A of wiring shape, and the tungsten silicide film 152 was anisotropically etched by an RIE technique to form a tungsten silicide film pattern 152A with a width which is wider than that of the opening 199 in the CVD-silicon oxide film 142 (which constitutes the upper portion of the gate line of the MOSFET). In the step of etching the tungsten silicide film 152, the CVD-silicon oxide film 142 functioned as an etch stop, and it was possible to etch the tungsten silicide film 152 efficiently and easily.

Next, using the resist pattern 170 as an implant mask, phosphorus ions were implanted at a low dose through the gate oxide layer 112, poly-Si film 120 and the CVD-silicon oxide film 142 into the semiconductor layer 100 to form a first semiconductor region 200A of n-type and a second semiconductor region 200B of n-type in the p-type semiconductor layer 100 as shown in FIG. 3C.

After depositing a silicon oxide film (not shown) on the silicon oxide film 140 to cover the side surfaces of the upper portion of the gate line, the silicon oxide film was etched back to expose the surface of the poly-Si film 120 using anisotropic RIE technique. Silicon oxide films (sidewall spacers) 210A and 210B were left on the side surfaces of the patterns 160A and 152A, and silicon oxide films 142A and 142B were left under the silicon oxide films 210A and 210B.

Figure 3D:
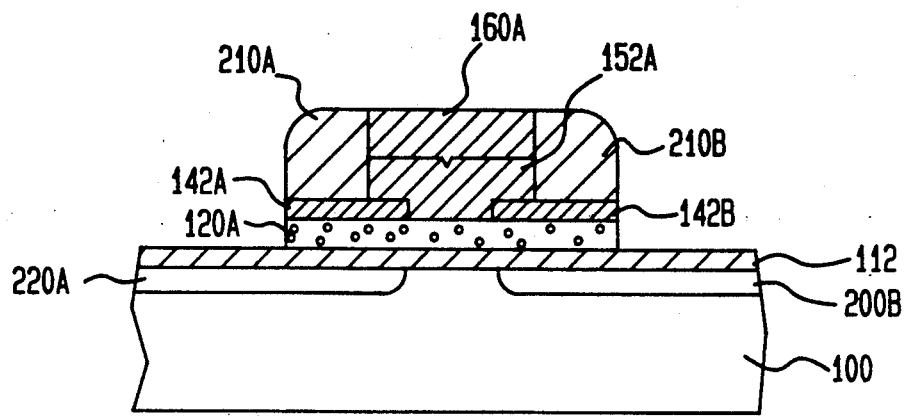

As shown in FIG. 3D, using the upper portion of the gate line, the silicon oxide films 142A and 142B, and the silicon oxide films 210A and 210B as an etching mask, the poly-Si film 120 was etched to form a poly-Si pattern 120A which is the under portion of the gate line of the MOSFET.

Figure 3E:
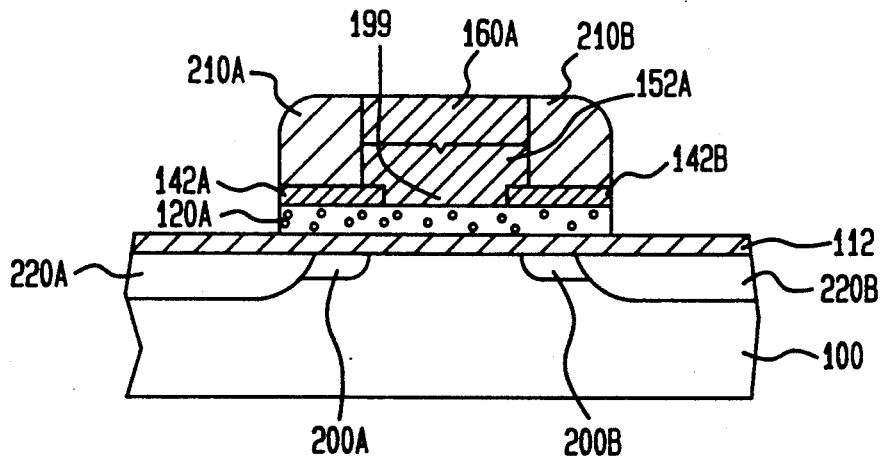

By the nearly vertical ion implantation method, arsenic ions were implanted into the semiconductor layer 100 at a dose of 2 to $9 \times 10^{15}$ cm$^{-2}$, using the silicon oxide films 210A and 210B and the tungsten silicide film 152A as an implant mask, thereby forming a third semiconductor region 220A of n+-type and a fourth semiconductor region 220B of n+-type in the p-type semiconductor layer 100, as shown in FIG. 3E. The first semiconductor region 200A and the third semiconductor region 220A constitute the source of the MOSFET. The second semiconductor region 200B and the fourth semiconductor region 220B constitute the drain of the MOSFET.

According to this embodiment, the buffer film 140 which is interposed between the tungsten silicide film 152 and the poly-Si film 120 is used as an etch stop in the step of etching the tungsten silicide film 152. Therefore, etching of the tungsten silicide film 152 can be conducted with ease even under the anisotropic dry etch conditions. According to the embodiment, therefore, excellent shape of the gate line (or electrode) made of metals or metal compounds can be obtained.

In addition, the buffer film 140 effectively prevented chemical interactions between the tungsten silicide film 152 and the poly-Si film 120, and a gate line having an excellent reliability can be obtained.

Example 4

Figure 4A:
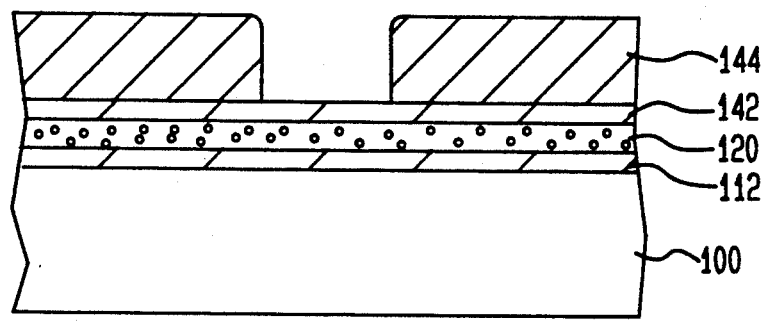
FIGS. 4A to 4E are cross sectional views illustrating the steps of fabricating an n-channel MOSFET according to a fourth embodiment of the invention.

Referring to FIGS. 4A to 4E which illustrate the steps of fabricating an n-channel MOSFET, we will describe a fourth embodiment of the invention. In this embodiment, as shown in FIG. 4A, a gate oxide layer (about 10 to 30 nm thick) 112 as a first insulating film, a poly-Si film (about 100 to 150 nm thick) 120 as a first conductive film, and a CVD-silicon oxide film (about 30 to 100 nm thick) 142 were successively formed over a semiconductor layer 100. A resist pattern 144 which defines the pattern of openings (0.3 to 0.5 pm width) to be formed in the CVD-silicon oxide film 142 (FIG. 4B) was photolithographically formed on the CVD-silicon oxide film 142.

Figure 4B:
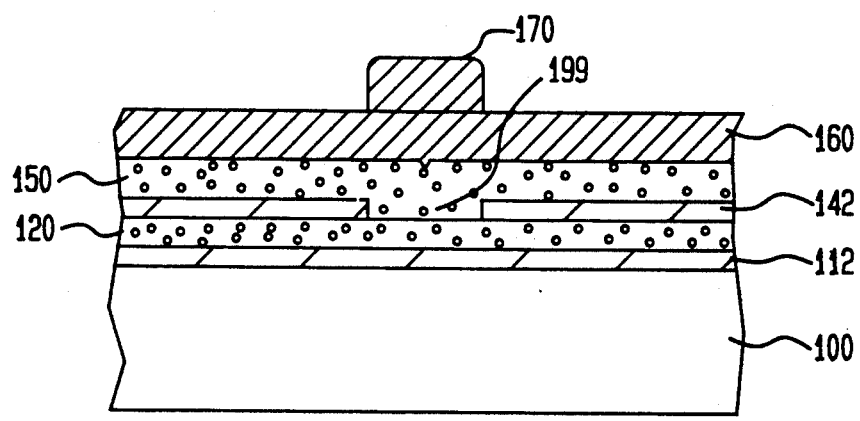

The CVD-silicon oxide film 142 was selectively etched using the resist pattern 144 as an etching mask to form opening 199 in the CVD-silicon oxide film 142. After removing the resist pattern 144 from the CVD-silicon oxide film 412, a poly-Si film (200 to 300 nm thick) 150 and a silicon oxide film (about 200 nm thick) 160 were successively deposited over the CVD-silicon oxide film 142. As shown in FIG. 4B, the poly-Si film 150 contacted the poly-Si film 120 through the opening 199 of the CVD-silicon oxide film 142. In order to reduce the resistivity of the poly-Si films 120 and 150, diffusion of dopants into the poly-Si film 120 and 150 was conducted by the process as mentioned in Example 1.

A resist pattern 170 which defines the gate line region was formed on the silicon oxide film 160 so as to fully cover the opening 199 of the silicon oxide film 140 as shown FIG. 4B. Resist pattern 170, which is formed on the surface of the silicon oxide film 160 has a width which is wider than that of the opening 199 in the CVD-silicon oxide film 142. The resist pattern 170 had a width of 0.8 to 1.0 μm. Using the resist pattern 170 as an etching mask, the silicon oxide film 160 was anisotropically etched by an RIE technique to form a silicon oxide film pattern 160A of wiring shape, and the poly-Si film 150 was anisotropically etched by an RIE technique to form a poly-Si film pattern 150A (which constitutes the upper portion of the gate line of the MOSFET). In the step of etching the poly-Si film 150, the CVD-silicon oxide film 142 functioned as an etch stop, and it was possible to etch the poly-Si film 150 efficiently and easily.

Figure 4C:
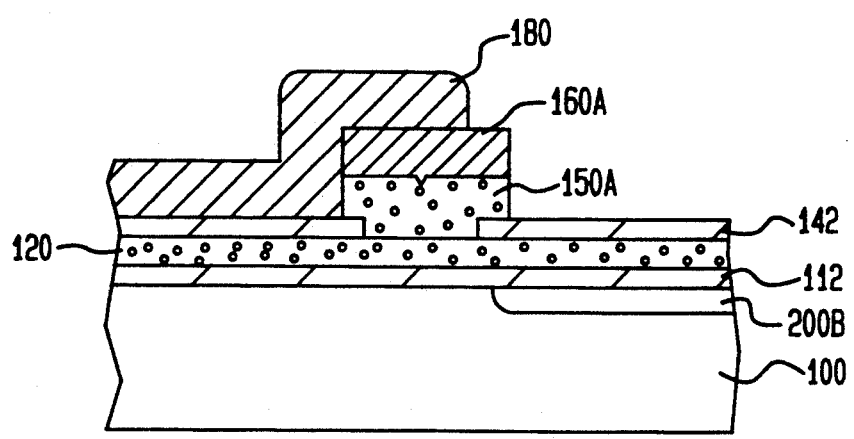

After removing the resist pattern 170, a resist pattern 180 was formed on the poly-Si film 142 to cover the region which is to become the source of the MOSFET. Using the resist pattern 180 and the poly-Si film pattern 150A with a width which is wider than that of the opening 199 in the CVD-silicon oxide film 142 as an implant mask, phosphorus ions were implanted at a low dose through the gate oxide layer 112, poly-Si film 120 and the CVD-silicon oxide film 142 to form a semiconductor region 200B of n-type in the p-type semiconductor layer 100 as shown in FIG. 4C.

After depositing a silicon oxide film 210 on the CVD-silicon oxide film 142 to cover the side surfaces of the upper portion of the gate line, the silicon oxide film 210 was etched back to expose the surface of the poly-Si film 120 using an anisotropic RIE technique. Silicon oxide films (sidewall spacers) 210A and 210B were left on the side surfaces of the patterns 160A and 150A, and silicon oxide films 142A and 142B were left under the silicon oxide films 210A and 210B.

Figure 4D:
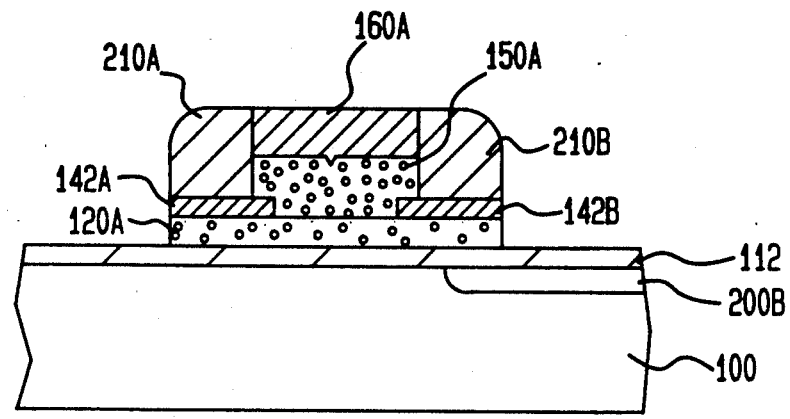

As shown in FIG. 4D, using the upper portion of the gate line, the silicon oxide films 140A and 140B, and the silicon oxide films 210A and 210B as an etching mask, the poly-Si film 120 was etched to form a poly-Si pattern 120A which is the under portion of the gate line of the MOSFET.

Figure 4E:
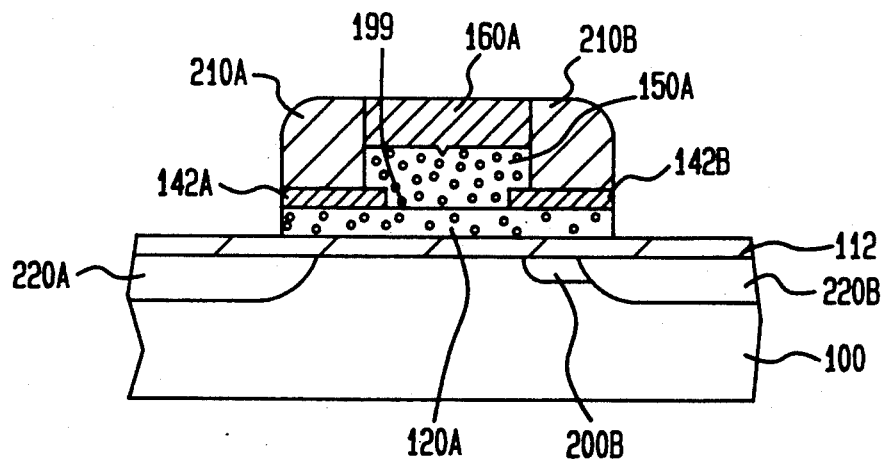

By the nearly vertical ion implantation method, arsenic ions were implanted into the semiconductor layer 100 at a dose of 2 to $9 \times 10^{15}$ cm$^{-2}$, using the silicon oxide films 210A and 210B and poly-Si film 150A as an implant mask, thereby forming a third semiconductor region 220A of n$^+$-type and a fourth semiconductor region 220B of n$^+$-type as in the p-type semiconductor layer 100, as shown in FIG. 4E. The third semiconductor region 220A constitutes the source of the MOSFET. The second semiconductor region 200B and the fourth semiconductor region 220B constitute the drain of the MOSFET.

According to this embodiment, a lightly doped region was not formed in the end part of the source. Therefore, the resistance of the source was reduced and a MOSFET having a high driving ability was obtained.

Example 5

Figure 5A:
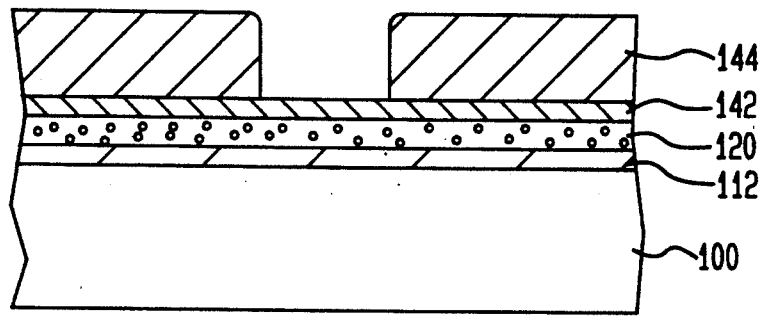
FIGS. 5A to 5E are cross sectional views illustrating the steps of fabricating an n-channel MOSFET according to a fifth embodiment of the invention.

Referring to FIGS. 5A to 5E which illustrate the steps of fabricating an n-channel MOSFET, we will describe a fifth embodiment of the invention. In this embodiment, as shown in FIG. 5A, a gate oxide layer (about 10 to 30 nm thick) 112 as a first insulating film, a poly-Si film (about 50 to 150 nm thick) 120 as a first conductive film, and a CVD-silicon oxide film (about 50 to 150 nm thick) 142 were successively formed over a semiconductor layer 100 and the oxide layer 110. A resist pattern 144 which defines the pattern of opening (0.3 to 0.5 μm width) to be formed in the CVD-silicon oxide film 142 (FIG. 5B) was photolithographically formed on the CVD-silicon oxide film 142.

Figure 5B:
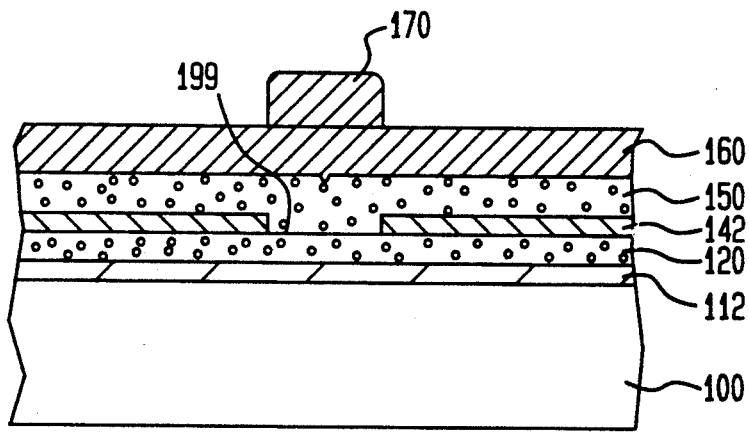

The CVD-silicon oxide film 142 was selectively etched using the resist pattern 144 as an etching mask to form opening 199 in the CVD-silicon oxide film 142. After removing the resist pattern 144, a poly-Si film (150 to 250 nm thick) 150 and a silicon oxide film (about 200 nm thick) 160 were successively deposited over the CVD-silicon oxide film 142. As shown in FIG. 5B, the poly-Si film 150 contacted the poly-Si film 120 through the opening 199 of the CVD-silicon oxide film 142. In order to reduce the resistivity of the poly-Si films 120 and 150, diffusion of dopants into the poly-Si film 120 and 150 was conducted by the process mentioned in Example 1.

A resist pattern 170 which defines the gate line region was formed on the silicon oxide film 160 so as to cover the opening 199 of the CVD-silicon oxide film 142 as shown FIG. 5B. Resist pattern 170, which is formed on the surface of the silicon oxide film 160 has a width which is wider than that of the opening 199 in the CVD-silicon oxide film 142. The resist pattern 170 has a width of 0.5 to 0.8 μm.

Figure 5C:
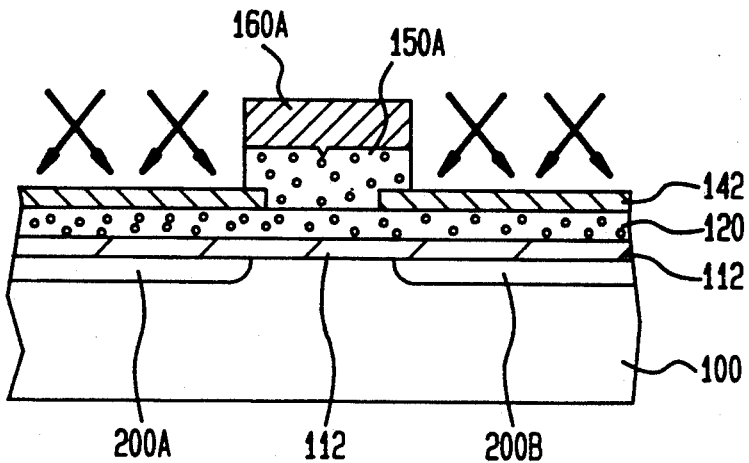

Using the resist pattern 170 as an etching mask, the silicon oxide film 160 was anisotropically etched by an RIE technique to form a silicon oxide film pattern 160A of wiring shape, and the poly-Si film 150 was anisotropically etched by an RIE technique to form a poly-Si film pattern 150A with a width which is wider than that of the opening 199 in the CVD-silicon oxide film 142 (which constitutes the upper portion of the gate line of the MOSFET), as shown in FIG. 5C. In the step of etching the poly-Si film 150, the CVD-silicon oxide film 142 functioned as an etch stop, and it was possible to etch the poly-Si film 150 efficiently and easily.

Next, by an oblique ion implantation method (in which a tilt angle between the normal of the wafer flat and the direction of ion beam is set to be at 10° or more), phosphorus ions were implanted at a dose of $5 \times 10^{12}$ to $1 \times 10^{15}$ cm$^{-2}$, into the semiconductor layer 100 through the gate oxide layer 112, poly-Si film 120 and the CVD-silicon oxide film 142 to form a first semiconductor region 200A of n-type and a second semiconductor region 200B of n-type in the p-type semiconductor layer 100, as shown in FIG. 5C. The edge portions of the first semiconductor region 200A and the second semiconductor region 200B were formed so as to overlap the poly-Si film pattern 150A.

Figure 5D:
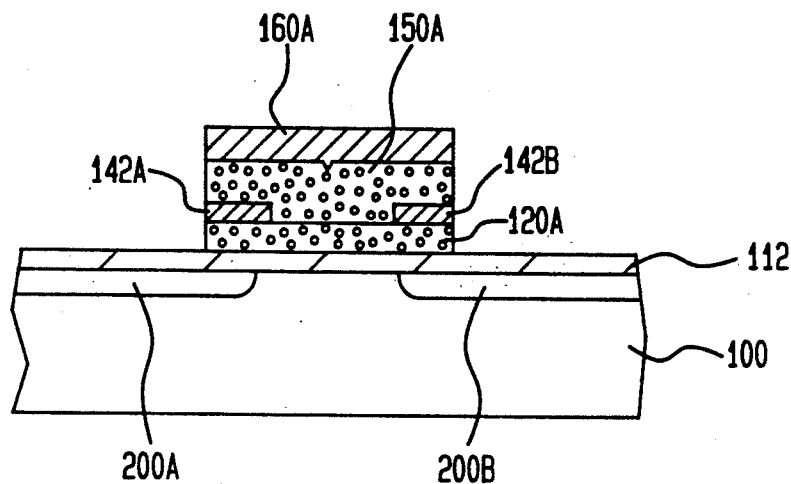

Using an anisotropic RIE technique, the CVD-silicon oxide film 142 was etched, and silicon oxide films 142A and 142B were left under the poly-Si film pattern 150A. As shown in FIG. 5D, using the upper portion of the gate line and the silicon oxide films 142A and 142B as an etching mask, the poly-Si film 120 was etched to form a poly-Si film pattern 120A (which is the under portion of the gate line of the MOSFET).

Figure 5E:
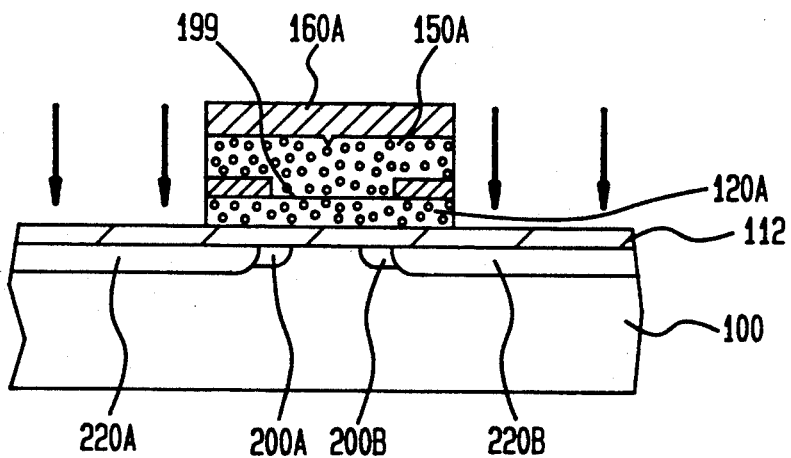

By the nearly vertical ion implantation method, arsenic ions were implanted into the semiconductor layer 100 at a dose of 2 to $9 \times 10^{15}$ cm$^{-2}$, using the poly-Si film 150A as an implant mask, thereby forming a third semiconductor region 220A of n$^+$-type as a part of the source and a fourth semiconductor region 220B of n$^+$-type as a part of the drain in the p-type semiconductor layer 100, as shown in FIG. 5E. The first semiconductor region 200A and the third semiconductor region 220A constitute the source of the MOSFET. The second semiconductor region 200B and the fourth semiconductor region 220B constitute the drain of the MOSFET.

According to this embodiment, in order to form the first semiconductor region 200A and the second semiconductor region 200B overlapping the poly-Si film pattern 120A, the oblique implantation technique was used. During the oblique implantation, the silicon oxide films 142 functioned to prevent the channeling effect of ions. Therefore, variations in the length of the overlap between the gate line and the drain were reduced so that variations in the length of the channel of the MOSFET were reduced.

The step of implanting ions by the oblique implantation may by conducted after etching the buffer film 142 to form the silicon oxide films 142A and 142B. In this case, the silicon oxide films 142A and 142B which were left on the edges of the poly-Si film pattern 120A prevent the channeling effect to occur in the edge of the drain.

The buffer film may be formed by the process of the first embodiment.

Example 6

Figure 6A:
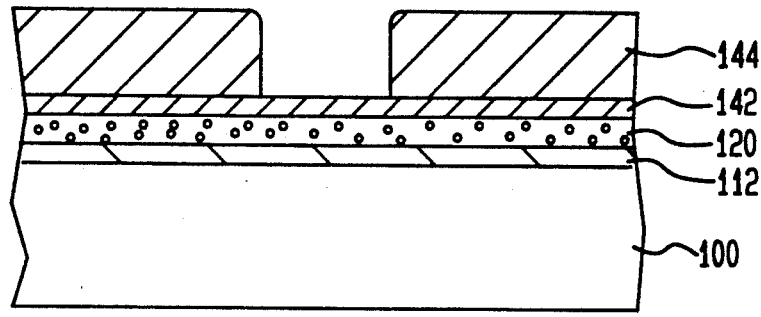
FIGS. 6A to 6E are cross sectional views illustrating the steps of fabricating an n-channel MOSFET according to a sixth embodiment of the invention.

Referring to FIGS. 6A to 6E which illustrate the steps of fabricating an n-channel MOSFET, we will describe a sixth embodiment of the invention. In this embodiment, as shown in FIG. 6A, a gate oxide layer (about 10 to 30 nm thick) 112 as a first insulating film, a poly-Si film (about 50 to 150 nm thick) 120 as a first conductive film, and a CVD-silicon oxide film (about 50 to 150 nm thick) 142 were successively formed over a semiconductor layer 100. A resist pattern 144 which defines the pattern of openings (0.3 to 0.5 μm width) to be formed in the CVD-silicon oxide film 142 (FIG. 6B) was photolithographically formed on the CVD-silicon oxide film 142.

Figure 6B:
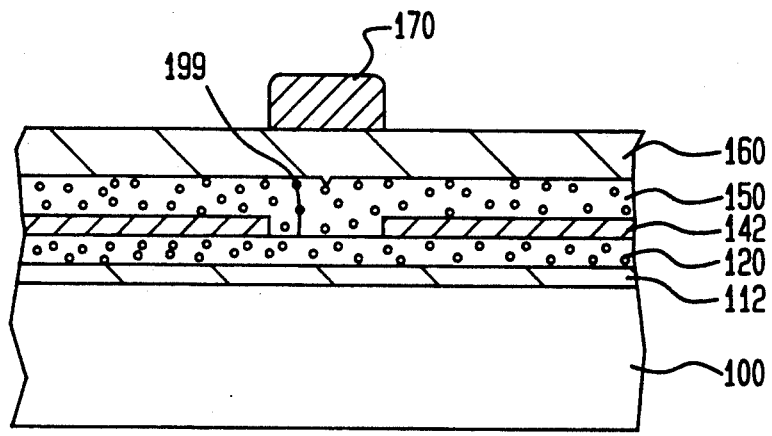

The CVD-silicon oxide film 142 was selectively etched using the resist pattern 144 as an etching mask to form an opening 199 in the CVD-silicon oxide film 142. After removing the resist pattern 144 from the CVD-silicon oxide film 142, a poly-Si film (150 to 250 nm thick) 150 and a silicon oxide film (about 200 nm thick) 160 were successively deposited over the CVD-silicon oxide film 142. As shown in FIG. 6B, the poly-Si film 150 contacted the poly-Si film 120 through the opening 199 of the CVD-silicon oxide film 142. In order to reduce a resistivity of the poly-Si films 120 and 150, diffusion of dopants into the poly-Si film 120 and 150 was conducted by the process as mentioned in Example 1.

A resist pattern 170 which defines the gate line region was formed on the silicon oxide film 160 so as to cover the opening 199 of the CVD-silicon oxide film 142 as shown FIG. 6B. Resist pattern 170, which is formed on the surface of the silicon oxide film 160 has a width which is wider than that of the opening 199 in the CVD-silicon oxide film 142. The resist pattern 170 had a width of 0.5 to 0.8 μm. Using the resist pattern 170 as an etching mask, the silicon oxide film 160 was anisotropically etched by an RIE technique to form a silicon oxide film pattern 160A of wiring shape, and the poly-Si film 150 was anisotropically etched by an RIE technique to form a poly-Si film pattern 150A with a width which is wider than that of the opening 199 in the CVD-silicon oxide film 142 (which constitutes the upper portion of the gate line of the MOSFET). In the step of etching the poly-Si film 150, the CVD-silicon oxide film 142 functioned as an etch stop, and it was possible to etch the poly-Si film 150 efficiently and easily.

Using an anisotropic RIE technique, the CVD-silicon oxide film 142 was selectively etched to form silicon oxide films 142A and 142B under the poly-Si film pattern 150A. Using the upper portion of the gate line and the silicon oxide films 142A and 142B as an etching mask, the poly-Si film 120 was etched to form a poly-Si pattern 120A (which is the under portion of the gate line of the MOSFET).

Figure 6C:
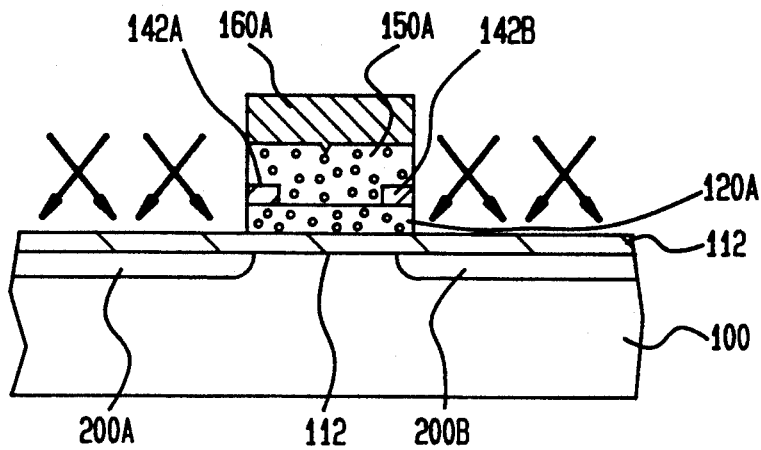

Next, by an oblique implantation technique, phosphorus ions were implanted at a low dose of $55 \times 10^{12}$ to $1 \times 10^{15}$ cm$^{-2}$, into the semiconductor layer 100 through the gate oxide layer 112, poly-Si film 120 and the CVD-silicon oxide film 142 to form a first semiconductor region 200A of n-type and a second semiconductor region 200B of n-type in the p-type semiconductor layer 100 as shown in FIG. 6C. The edge portions of the first semiconductor region 200A and the second semiconductor region 200B were formed so as to overlap the poly-Si film pattern 150A.

Figure 6D:
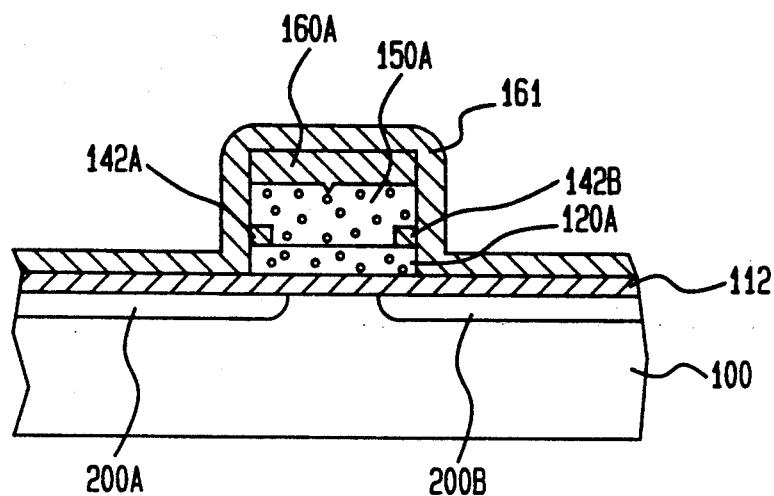

After depositing a silicon oxide film 161 on the gate oxide layer 112 to cover the gate line as shown in FIG. 6D, the silicon oxide film 161 was etched back to expose the surface of the silicon oxide film 112 using an anisotropic RIE technique. Silicon oxide films (sidewall spacers) 161A and 161B were left on the side surfaces of the patterns 160A, 150A and 120A as shown in FIG. 6E.

Figure 6E:
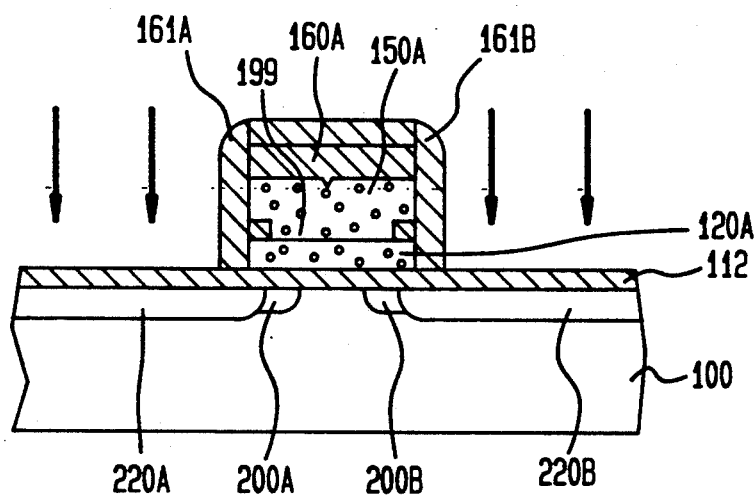

By the nearly vertical ion implantation method, arsenic ions were implanted into the semiconductor layer 100 at a dose of 2 to $9 \times 10^{15}$ cm$^{-2}$, using the gate line and the silicon oxide films 161A and 161B as an implant mask, thereby forming a third semiconductor region 220A of n+-type and a fourth semiconductor region 220B of n+-type in the p-type semiconductor layer 100, as shown in FIG. 6E. The first semiconductor region 200A and the third semiconductor region 220A constitute the source of the MOSFET. The second semiconductor region 200B and the fourth semiconductor region 220B constitute the drain of the MOSFET.

According to this embodiment, in order to form the first semiconductor region 200A and the second semiconductor region 200B overlapping the poly-Si film pattern 120A, the oblique implantation technique was used. During the oblique implantation, the silicon oxide films 142A and 142B which were present on the edge portion of the poly-Si film pattern 120A functioned to prevent the channeling effect of ions.

According to this embodiment, a length of the overlap region between the under portion of the gate line and the fourth semiconductor region 220B can be precisely controlled by adjusting the thickness of the silicon oxide films 161A and 161B, to obtain an excellent reliability.

Example 7

Figure 7A:
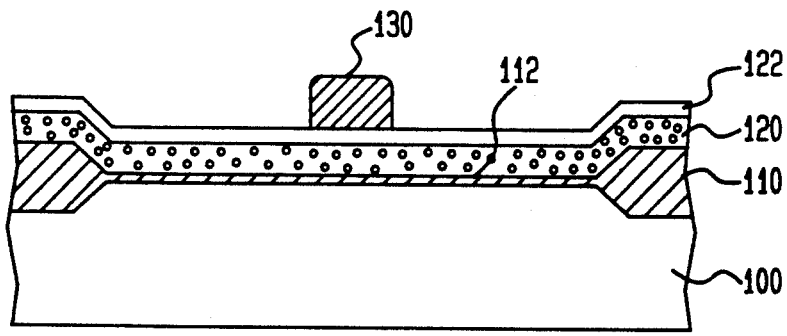
FIGS. 7A to 7G are cross sectional views illustrating the steps of fabricating an n-channel MOSFET according to a seventh embodiment of the invention.

Referring to FIGS. 7A to 7G which illustrate the steps of fabricating an n-channel MOSFET, we will describe a seventh embodiment of the invention. In this embodiment, as shown in FIG. 7A, a p-type single crystalline silicon semiconductor layer 100 was provided with oxide layer (about 500 nm thick) 110 for isolation and element region surrounded by the oxide layer 110. A gate oxide layer (about 10 to 30 nm thick) 112 as a first insulating film, a poly-Si film (about 50 to 150 nm thick) 120 as a first conductive film, and a silicon nitride film (about 40 nm thick) 122 were successively formed over the semiconductor layer 100 and the oxide layer 110. A resist pattern 130 which defines the pattern of openings to be formed in the silicon oxide film 140 (FIG. 7B) was photolithographically formed on the silicon nitride film 122.

Figure 7B:
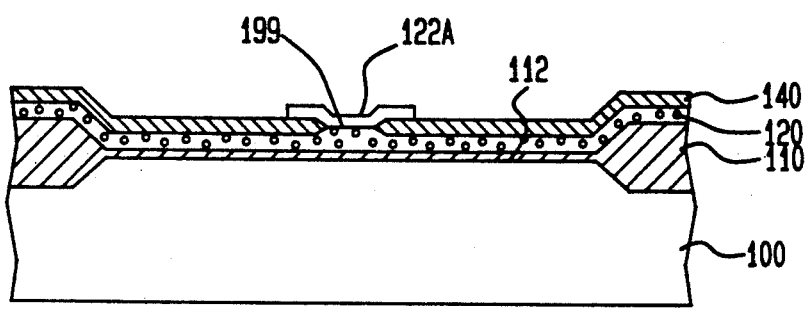

The silicon nitride film 122 was etched to expose the poly-Si film 120 using the resist pattern 130 as an etching mask. The resist pattern 130 was then removed leaving the silicon nitride pattern 122A in the gate line region. The resist pattern 130 has a width of 0.6 to 0.8 μm and serves as an oxidation resistant layer. Then, as shown in FIG. 7B, the surface of the poly-Si film 120 was selectively oxidized to form a silicon oxide film (10 to 100 nm thick) 140 which functions as a buffer film.

Figure 7C:
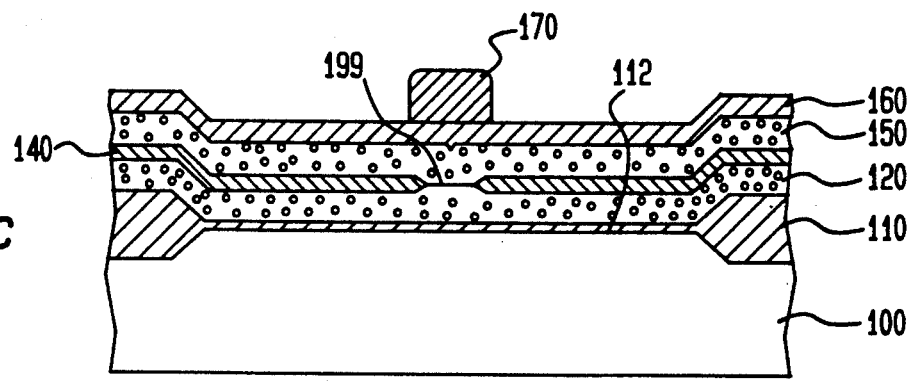

The silicon nitride pattern 122A was then removed to form an opening 199 in the silicon oxide film 140. A poly-Si film (200 to 300 nm thick) 150 as a third conductive film and a silicon oxide film (about 200 nm thick) 160 were successively deposited over the silicon oxide film 140. As shown in FIG. 7C, the poly-Si film 150 contacted the poly-Si film 120 through the opening 199 in the silicon oxide film 140. In order to reduce the resistivity of the poly-Si films 120 and 150, diffusion of dopants into the poly-Si film 120 and 150 was conducted by the process as mentioned in Example 1.

Figure 7D:
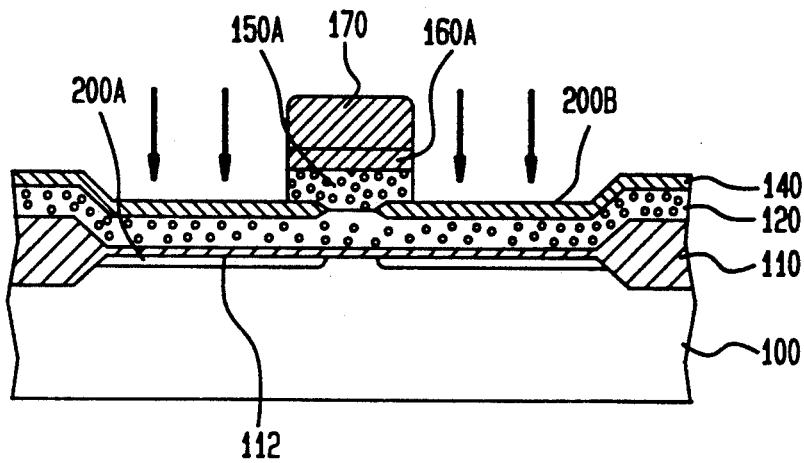

The resist pattern 170 which defines the gate line region was formed on the silicon oxide film 160 so as to cover the opening 199 of the silicon oxide film 140 as shown FIG. 1C. Resist pattern 170, which is formed on the surface of the silicon oxide film 160 has a width which is wider than that of the opening 199 in the silicon oxide film 140. The resist pattern 170 had a width of 0.8 to 1.0 μm. As shown in FIG. 7D, using the resist pattern 170 as an etching mask, the silicon oxide film 160 was anisotropically etched by an RIE technique to form a silicon oxide film pattern 160A of wiring shape, and the poly-Si film 150 was anisotropically etched by an RIE technique to form a poly-Si film pattern 150A with a width which is wider than that of the opening 199 in the CVD-silicon oxide film 142 (which constitutes the upper portion of the gate line of the MOSFET). In the step of etching the poly-Si film 150, the silicon oxide film (the buffer film) 140 functioned as an etch stop, and it was possible to etch the poly-Si film 150 efficiently and easily.

Next, using the resist pattern 170 as an implant mask, phosphorus ions were implanted at a low dose through the gate oxide layer 112, poly-Si film 120 and the silicon oxide film 140 to form a first semiconductor region 200A of n-type and a second semiconductor region 200B of n-type in the p-type semiconductor layer 100 as shown in FIG. 7D.

Figure 7E:
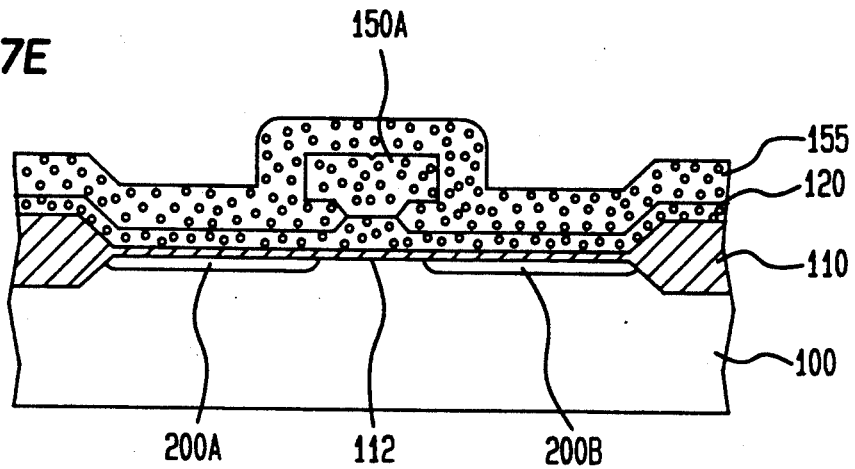

As shown in FIG. 7E, after removing the resist pattern 170 (not shown in FIG. 7E) and removing the silicon oxide films 140 and 160 using an NH$_4$F solution, a poly-Si film 155 as a third conductive film was deposited on the poly-Si film 120 to cover the upper portion of the gate line. Using an anisotropic RIE technique, the poly-Si film 155 was etched back to expose the surface of the silicon oxide film 112. Poly-Si films (sidewall spacers) 155A and 155B were left on the side surfaces of the pattern 150A, as shown in FIG. 7F.

Figure 7F:
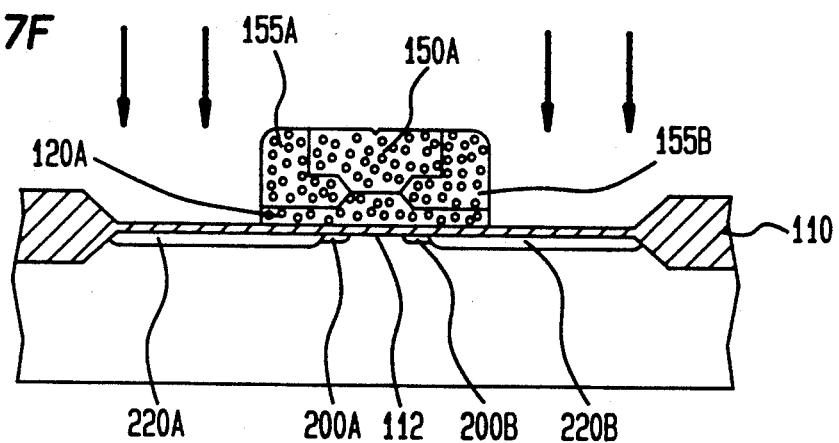

By the nearly vertical ion implantation method, arsenic ions were implanted into the semiconductor layer 100 at a dose of 2 to 9×10$^{15}$ cm$^{-2}$, using the ate line, thereby forming a third semiconductor region 220A of n$^+$-type and a fourth semiconductor region 220B of n$^+$-type in the p-type semiconductor layer 100, as shown in FIG. 7F. The first semiconductor region 200A and the third semiconductor region 220A constitute the source of the MOSFET. The second semiconductor region 200B and the fourth semiconductor region 220B constitute the drain of the MOSFET.

Figure 7G:
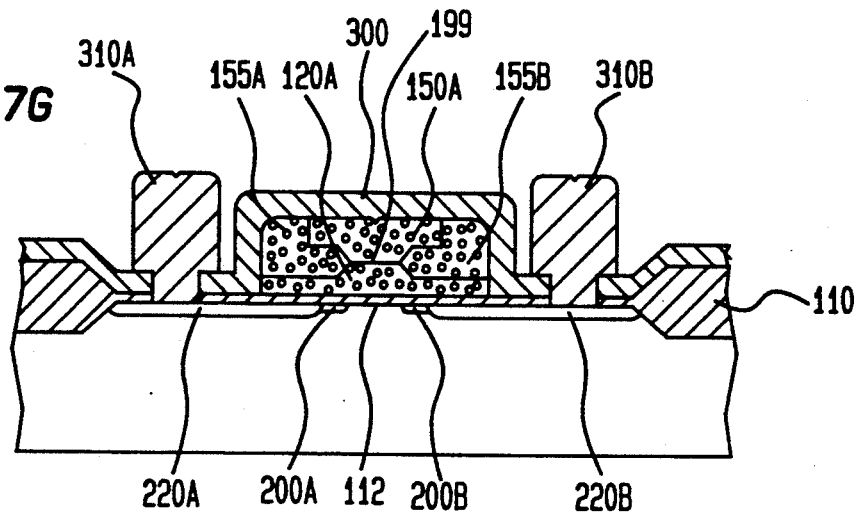

As shown in FIG. 7G, after depositing a silicon oxide film 300 over the entire surface of the semiconductor layer 100, contact windows were formed in the silicon film 300. Then, a source electrode 310A made of aluminum and a drain electrode 310B made of aluminum were formed on the silicon oxide film 300 to contact the source and the drain of the MOSFET.

According to this embodiment, the conductive films (the poly-Si films 155A and 155B) were used as the sidewall spacers. Therefore, the gate line having lower resistance was obtained.

Example 8

Referring to FIGS. 8A to 8G which illustrate the steps of fabricating a gate line on a field oxide layer, we will describe an eighth embodiment of the invention. In this embodiment, as shown in FIG. 8, a p-type single crystalline silicon semiconductor layer 100 was provided with an oxide layer (about 500 nm thick) 110 for isolation. A poly-Si film (about 50 to 150 nm thick) 120 as a first conductive film, and a silicon nitride film (about 40 nm thick) 122 were successively formed over the oxide layer 110. A resist pattern 130 which defines the pattern of openings to be formed in the silicon oxide film 140 (FIG. 8B) was photolithographically formed on the silicon nitride film 122.

Figure 8A:
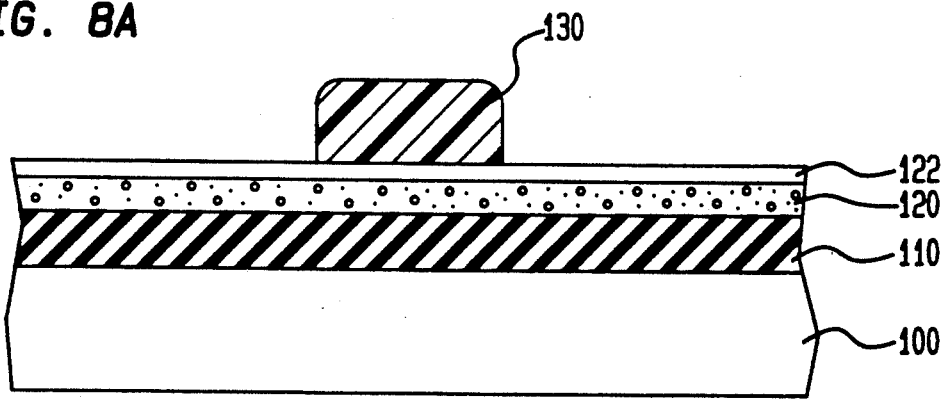
FIGS. 8A to 8G are cross sectional views illustrating the steps of fabricating an n-channel MOSFET according to a eighth embodiment of the invention.
Figure 8B:
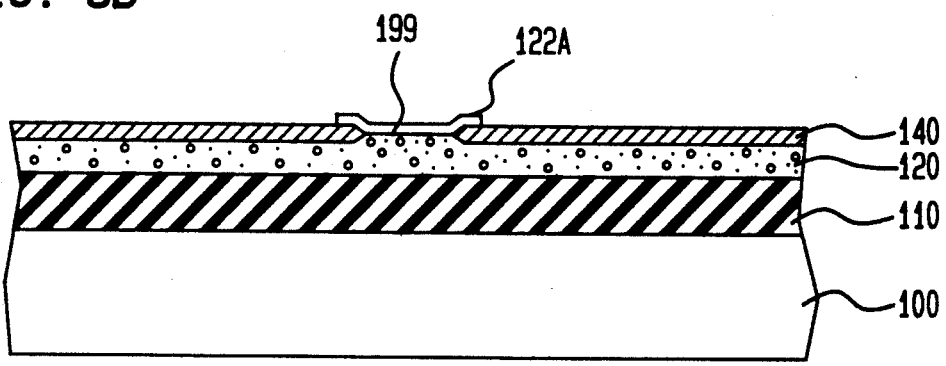

The silicon nitride film 122 was etched to expose the poly-Si film 120 using the resist pattern 130 as an etching mask. The resist pattern 130 was then removed leaving the silicon nitride pattern 122A in the gate line region. The resist pattern 130 has a width of 0.6 to 0.8 μm and serves as an oxidation resistant layer. Then, as shown in FIG. 8B, the surface of the poly-Si film 120 was selectively oxidized to form a silicon oxide film (10 to 100 nm thick) 140 which functions as a buffer film.

Figure 8C:
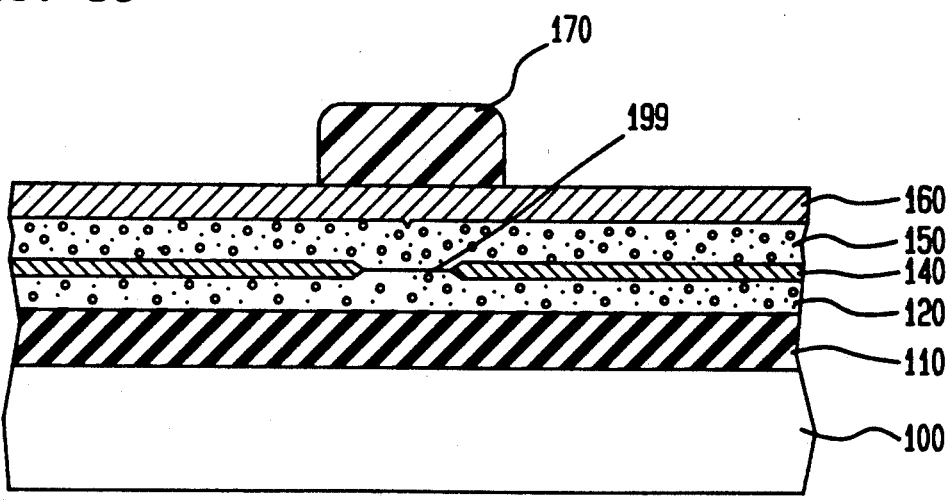

The silicon nitride pattern 122A was then removed from the poly-Si film 120 to form an opening 199 in the silicon oxide film 140. A poly-Si film (200 to 300 nm thick) 150 and a silicon oxide film (about 200 nm thick) 160 were successively deposited over the silicon oxide film 140. As shown in FIG. 8C, the poly-Si film 150 contacted the poly-Si film 120 through the opening 199 in the silicon oxide film 140. In order to reduce the resistivity of the poly-Si films 120 and 150, diffusion of dopants into the poly-Si film 120 and 150 was conducted by the process as mentioned in Example 1.

The resist pattern 170 which defines the line region was formed on the silicon oxide film 160 so as to cover the opening 199 of the silicon oxide film 140 as shown FIG. 8C. Resist pattern 170, which is formed on the surface of the silicon oxide film 160 has a width which is wider than that of the opening 199 in the silicon oxide film 140. The resist pattern 170 had a width of 0.8 to 1.0 μm.

Figure 8D:
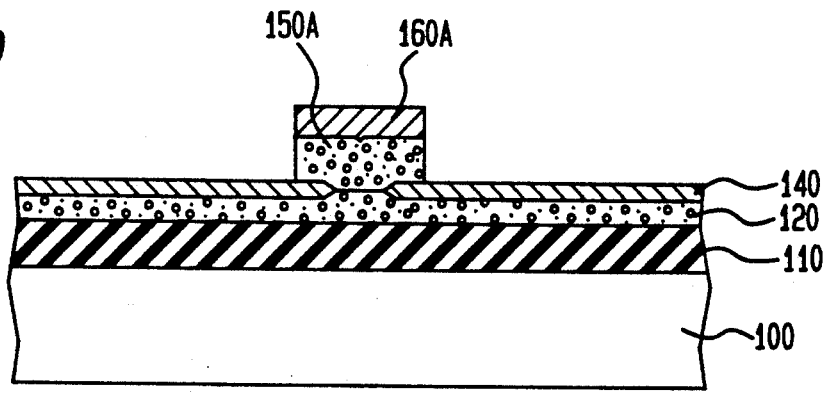

As shown in FIG. 8D, using the resist pattern 170 as an etching mask, the silicon oxide film 160 was anisotropically etched by an RIE technique to form a silicon oxide film pattern 160A of wiring shape, and the poly-Si film 150 was anisotropically etched by an RIE technique to form a poly-Si film pattern 150A (the upper portion of the gate line). In the step of etching the poly-Si film 150 with a width which is wider than that of the opening 199 in the CVD-silicon oxide film 142, the silicon oxide film (the buffer film) 140 functioned as an etch stop, and it was possible to etch the poly-Si film 150 efficiently and easily.

Figure 8E:
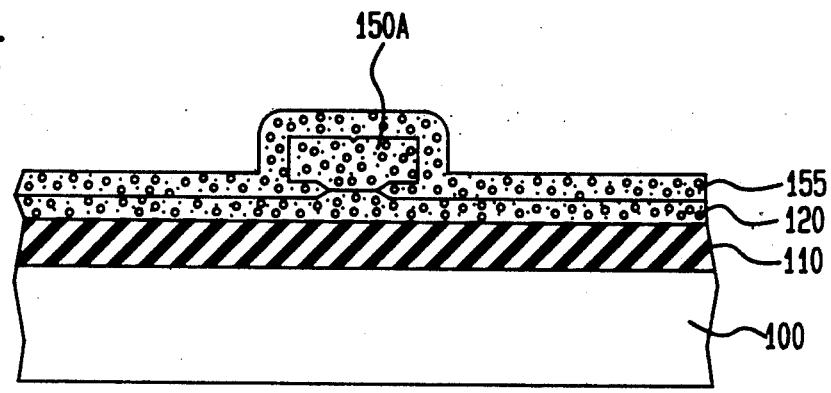
Figure 8F:
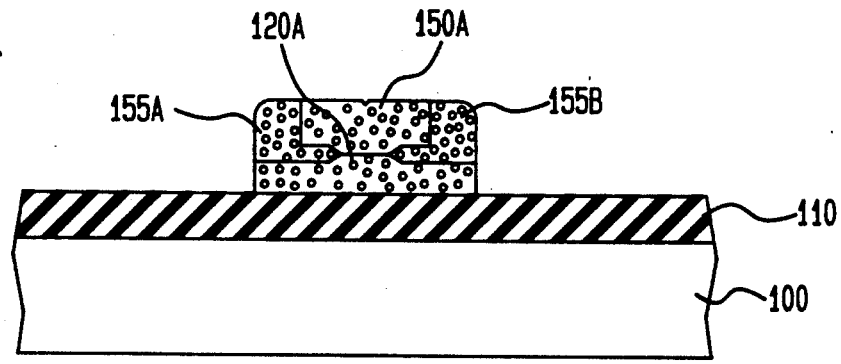

As shown in FIG. 8E, after removing the resist pattern 170 (not shown in FIG. 8E), and removing the silicon oxide films 140 and 160A, a poly-Si film 155 as a third conductive film was deposited on the poly-Si film 120 to cover the upper portion of the gate line. Using an anisotropic RIE technique, the poly-Si film 155 was etched back to expose the surface of the silicon oxide film 112. Poly-Si films (sidewall spacers) 155A and 155B were left on the side surfaces of the pattern 150A which is the under portion of the gate line, as shown in FIG. 8F.

Figure 8G:
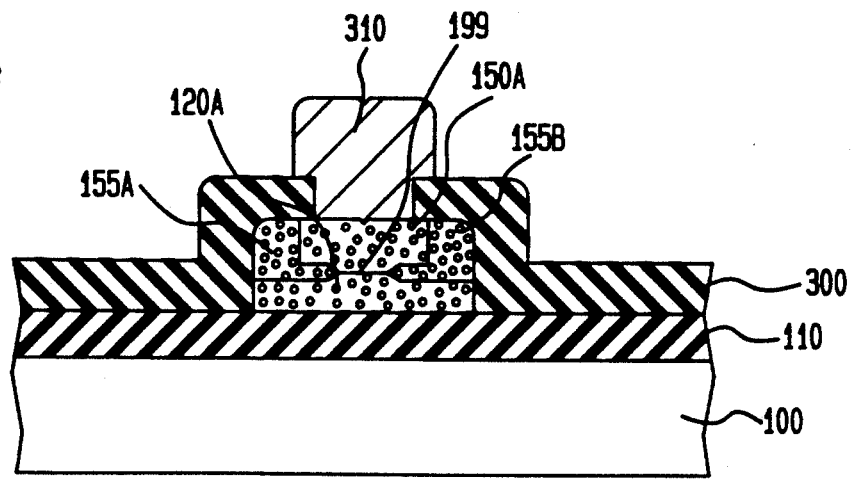

As shown in FIG. 8G, after depositing a silicon oxide film 300 over the entire surface of the semiconductor layer 100, contact windows were formed in the silicon film 300. Then, an electrode 310 made of aluminum was formed on the silicon oxide film 300 to contact the line.

Example 9

Figure 9A:
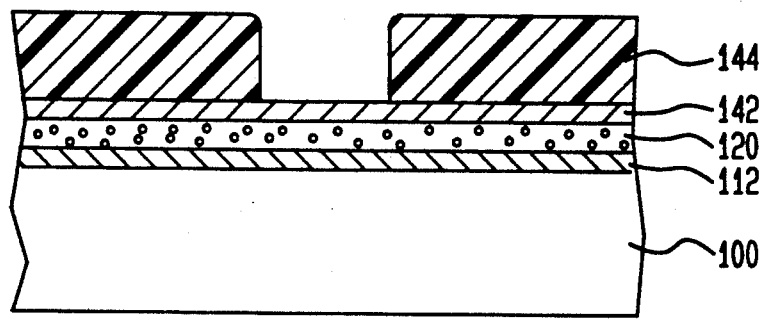
FIGS. 9A to 9E are cross sectional views illustrating the steps of fabricating an n-channel MOSFET according to a ninth embodiment of the invention.

Referring to FIGS. 9A to 9E which illustrate the steps of fabricating an n-channel MOSFET, we will describe a ninth embodiment of the invention. In this embodiment, as shown in FIG. 9A, a gate oxide layer (about 10 to 30 nm thick) 112 as a first insulating film, a poly-Si film (about 100 to 150 nm thick) 120 as a first conductive film, and a CVD-silicon oxide film (about 30 to 100 nm thick) 142 were successively formed over a semiconductor layer 100. A resist pattern 144 which defines the pattern of openings 199 (FIG. 9B) to be formed in the CVD-silicon oxide film 142 was photolithographically formed on the CVD-silicon oxide film 142.

Figure 9B:
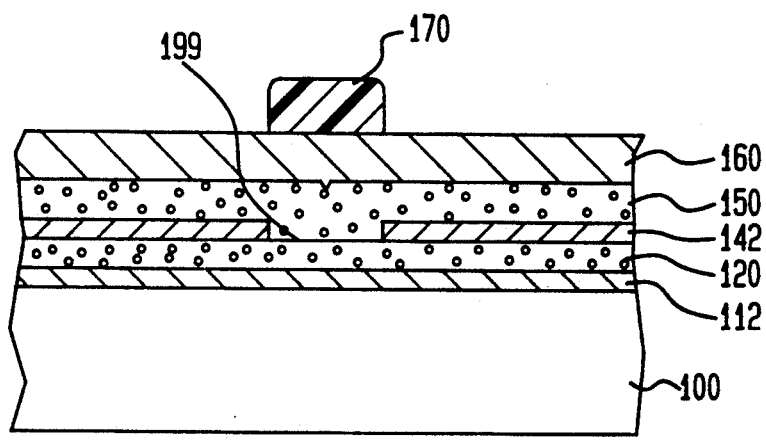

The CVD-silicon oxide film 142 was selectively etched using the resist pattern 144 as an etching mask to form opening in the CVD-silicon oxide film 142. After removing the resist pattern 144 from the CVD-silicon oxide film 142, a poly-Si film (200 to 300 nm thick) 150 as a second conductive film and a silicon oxide film (about 200 nm thick) 160 were successively deposited over the CVD-silicon oxide film 142. As shown in FIG. 9B, the poly-Si film 150 contacted the poly-Si film 120 through the opening 199 of the CVD-silicon oxide film 142. In order to reduce the resistivity of the poly-Si films 120 and 150, diffusion of dopants into the poly-Si film 120 and 150 was conducted by the process as mentioned in Example 1.

Figure 9C:
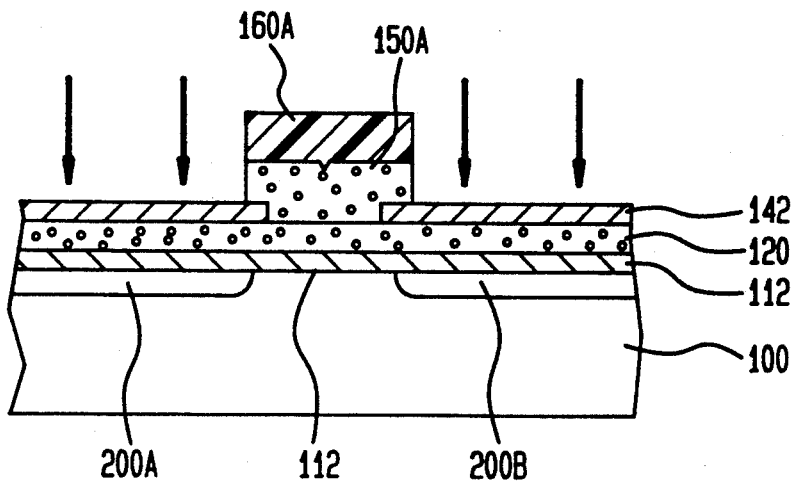

A resist pattern 170 which defines the gate line region was formed on the silicon oxide film 160 so as to cover the opening 199 of the CVD-silicon oxide film 142 as shown FIG. 9B. Resist pattern 170, which is formed on the surface of the silicon oxide film 160 has a width which is wider than that of the opening 199 in the CVD-silicon oxide film 142. The resist pattern 170 had a width of 0.8 to 1.0 μm. As shown in FIG. 9C, using the resist pattern 170 (not shown in FIG. 9C) as an etching mask, the silicon oxide film 160 was anisotropically etched by an RIE technique to form a silicon oxide film pattern 160A of wiring shape, and the poly-Si film 150 was anisotropically etched by an RIE technique to form a poly-Si film pattern 150A with a width which is wider than that of the opening 199 in the CVD-silicon oxide film 142 (which constitutes the upper portion of the gate line of the MOSFET). In the step of etching the poly-Si film 150, the CVD-silicon oxide film 142 functioned as an etch stop, and it was possible to etch the poly-Si film 150 efficiently and easily.

Next, using the resist pattern 170 (not shown in FIG. 9C) as an implant mask, phosphorus ions were implanted at a low dose through the gate oxide layer 112, poly-Si film 120 and the silicon oxide film 140 to form a first semiconductor region 200A of n-type and a second semiconductor region 200B of n-type in the p-type semiconductor layer 100 as shown in FIG. 9C.

Figure 9D:
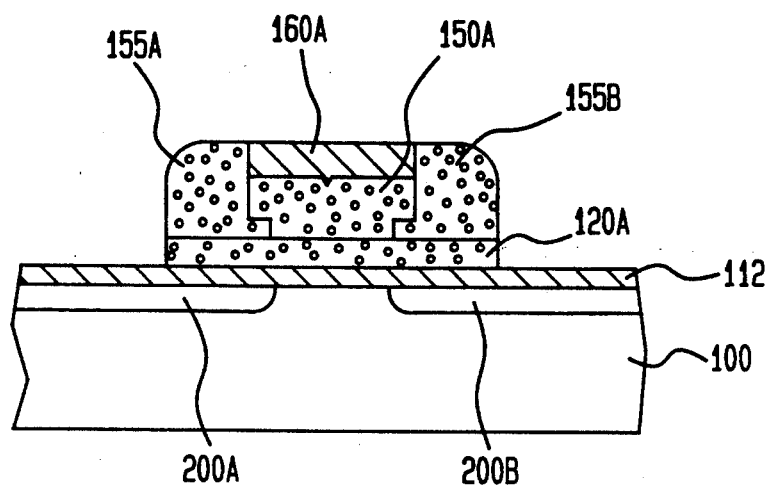

After removing the resist pattern 170, and removing the silicon oxide films 142 using an NH$_4$F solution, a poly-Si film as a third conductive film was deposited on the poly-Si film 120 to cover the upper portion of the gate line. Using an anisotropic RIE technique, the poly-Si film was etched back to expose the surface of the silicon oxide film 112. Poly-Si films (sidewall spacers) 155A and 155B were left on the side surfaces of the pattern 150A, as shown in FIG. 9D.

Figure 9E:
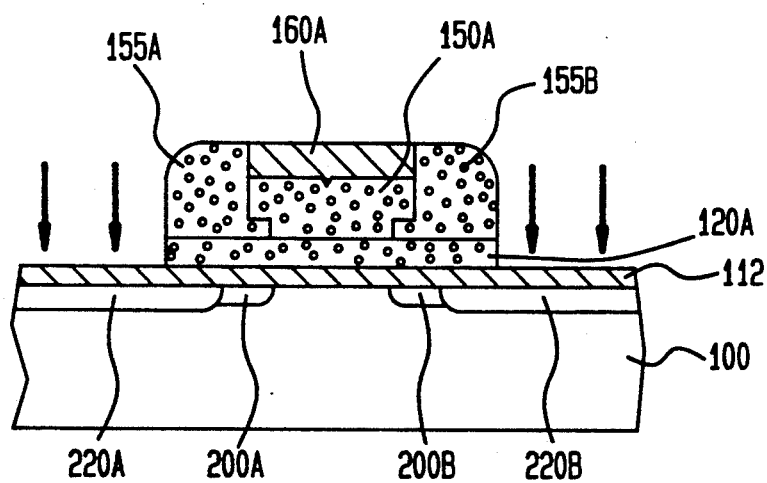

By the nearly vertical ion implantation method, arsenic ions were implanted into the semiconductor layer 100 at a dose of 2 to $9 \times 10^{15}$ cm$^{-2}$, using the ate line, thereby forming a third semiconductor region 220A of n$^+$-type and a fourth semiconductor region 220B of n$^+$-type in the p-type semiconductor layer 100, as shown in FIG. 9E. The first semiconductor region 200A and the third semiconductor region 220A constitute the source of the MOSFET. The second semiconductor region 200B and the fourth semiconductor region 220B constitute the drain of the MOSFETs.

According to this embodiment, the conductive films (the poly-Si films 155A and 155B) were used as the sidewall spacers. Therefore, the gate line having a lower resistance was obtained. In addition, according to this embodiment, it is not required to oxidize the poly-Si film 120 in the step of forming the buffer film on the poly-Si film 120. Therefore, an amorphous silicon film can be used instead of the poly-Si film 120. If the amorphous silicon film is used instead of the poly-Si film 120, the channeling effect is suppressed when phosphorus ions are implanted through the amorphous silicon film in order to form the first semiconductor region 200A and the second semiconductor region 200B in the p-type semiconductor layer 100.

Example 10

Figure 10A:
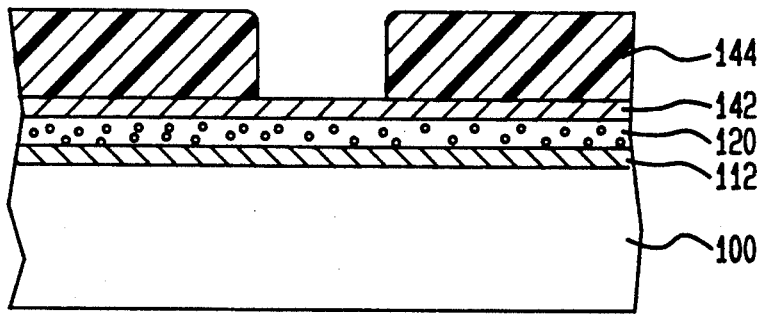
FIGS. 10A to 10E are cross sectional views illustrating the steps of fabricating an n-channel MOSFET according to a tenth embodiment of the invention.

Referring to FIGS. 10A to 10E which illustrate the steps of fabricating an n-channel MOSFET, we will describe a tenth embodiment of the invention. In this embodiment, as shown in FIG. 10A, a gate oxide layer (about 10 to 30 nm thick) 112 as a first insulating film, a poly-Si film (about 100 to 150 nm thick) 120 as a first conductive film, and a CVD-silicon oxide film (about 30 to 100 nm thick) 142 were successively formed over a semiconductor layer 100. A resist pattern 144 which defines the pattern of openings to be formed in the CVD-silicon oxide film 142 (FIG. 10B) was photolithographically formed on the CVD-silicon oxide film 142.

Figure 10B:
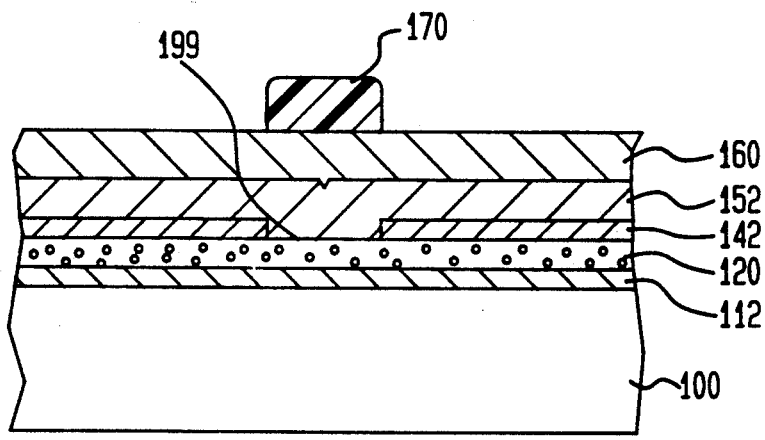

The CVD-silicon oxide film 142 was selectively etched using the resist pattern 144 as an etching mask to form opening in the CVD-silicon oxide film 142. After removing the resist pattern 144 from, a tungsten silicide film (200 to 300 nm thick) 152 as a second conductive film and a silicon oxide film (about 200 nm thick) 160 were successively deposited over the CVD-silicon oxide film 142. As shown in FIG. 10B, the tungsten silicide film 152 contacted the poly-Si film 120 through the opening 199 of the CVD-silicon oxide film 142. In order to reduce a resistivity of the poly-Si film 120, diffusion of dopants into the poly-Si film 120 was conducted by the process as mentioned in Example 1.

A resist pattern 170 which defines the gate line region was formed on the silicon oxide film 160 so as to cover the opening 199 of the CVD-silicon oxide film 142 as shown FIG. 10B. Resist pattern 170, which is formed on the surface of the silicon oxide film 160 has a width which is wider than that of the opening 199 in the CVD-silicon oxide film 142. The resist pattern 170 had a width of 0.8 to 1.0 μm. As shown in FIG. 9C, using the resist pattern 170 (not shown in FIG. 10C) as an etching mask, the silicon oxide film 160 was anisotropically etched by an RIE technique to form a silicon oxide film pattern 160A of wiring shape, and the tungsten silicide film 152 was anisotropically etched by an RIE technique to form a tungsten silicide film pattern 152A with a width which is wider than that of the opening 199 in the CVD-silicon oxide film 142 (which constitutes the upper portion of the gate line of the MOSFET). In the step of etching the tungsten silicide film 152, the CVD-silicon oxide film 142 functioned as an etch stop, and it was possible to etch the tungsten silicide film 152 efficiently and easily.

Figure 10C:
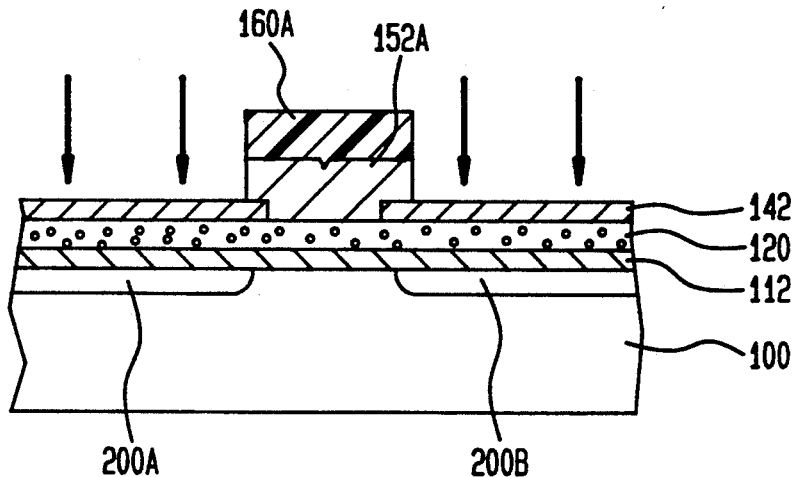

Next, using the resist pattern 170 as an implant mask (not shown in FIG. 10C), phosphorus ions were implanted at a low dose through the gate oxide layer 112, poly-Si film 120 and the silicon oxide film 140 to form a first semiconductor region 200A of n-type and a second semiconductor region 200B of n-type in the p-type semiconductor layer 100, as shown in FIG. 10C.

Figure 10D:
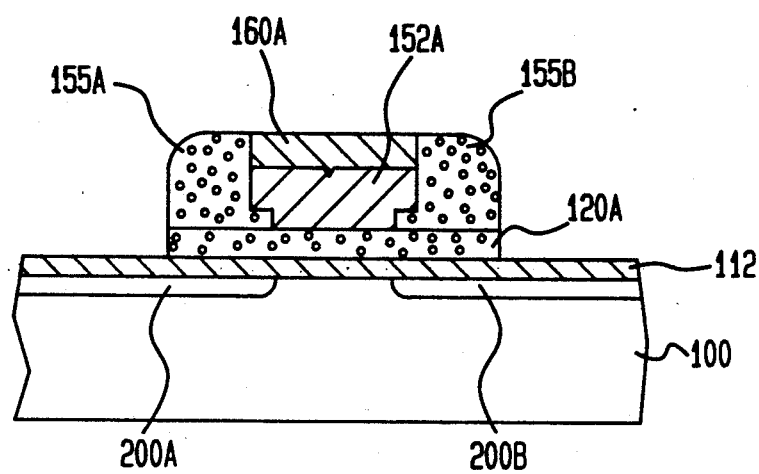

After removing the resist pattern 170, and removing the CVD-silicon oxide film 142 using an NH$_4$F solution, a poly-Si film as a third conductive film was deposited on the poly-Si film 120 to cover the upper portion of the gate line. Using an anisotropic RIE technique, the poly-Si film was etched back to expose the surface of the silicon oxide film 112. Poly-Si films (sidewall spacers) 155A and 155B were left on the side surfaces of the pattern 152A, as shown in FIG. 10D.

Figure 10E:
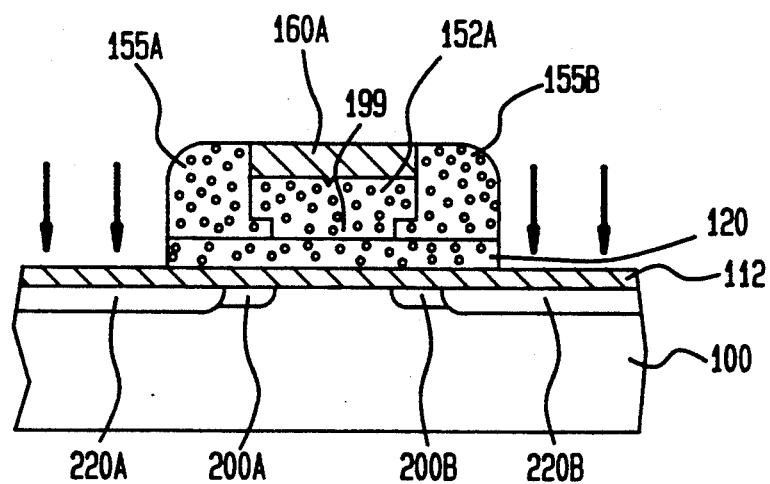

By the nearly vertical ion implantation method, arsenic ions were implanted into the semiconductor layer 100 at a dose of 2 to $9 \times 10^{15}$ cm$^{-2}$, using the gate line, thereby forming a third semiconductor region 220A of n$^+$-type and a fourth semiconductor region 220B of n$^+$-type in the p-type semiconductor layer 100, as shown in FIG. 10E. The first semiconductor region 200A and the third semiconductor region 220A constitute the source of the MOSFET. The second semiconductor region 200B and the fourth semiconductor region 220B constitute the drain of the MOSFETs.

According to this embodiment, the conductive films (the poly-Si films 155A and 155B) were used as the sidewall spacers, and the tungsten silicide film pattern 152A was used as the upper portion of the gate line. Therefore, the gate line having lower resistance was obtained.

Example 11

Figure 11A:
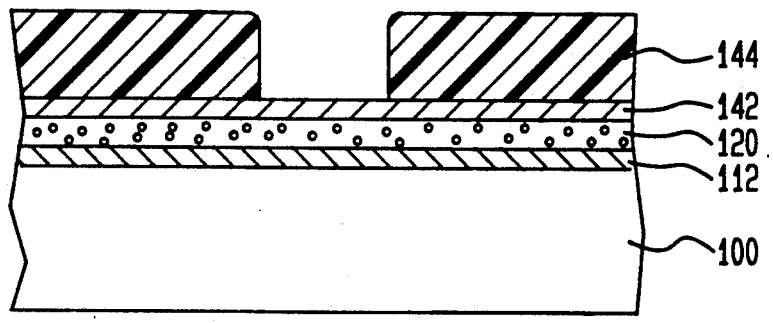
FIGS. 11A to 11E are cross sectional views illustrating the steps of fabricating an n-channel MOSFET according to a eleventh embodiment of the invention.

Referring to FIGS. 11A to 11E which illustrate the steps of fabricating an n-channel MOSFET, we will describe a eleventh embodiment of the invention. In this embodiment, as shown in FIG. 11A, a gate oxide layer (about 10 to 30 nm thick) 112 as a first insulating film, a poly-Si film (about 100 to 150 nm thick) 120 as a first conductive film, and a CVD-silicon oxide film (about 30 to 100 nm thick) 142 as a buffer film were successively formed over a semiconductor layer 100. A resist pattern 144 which defines the pattern of openings to be formed in the CVD-silicon oxide film 142 (FIG. 11B) was photolithographically formed on the CVD-silicon oxide film 142.

Figure 11B:
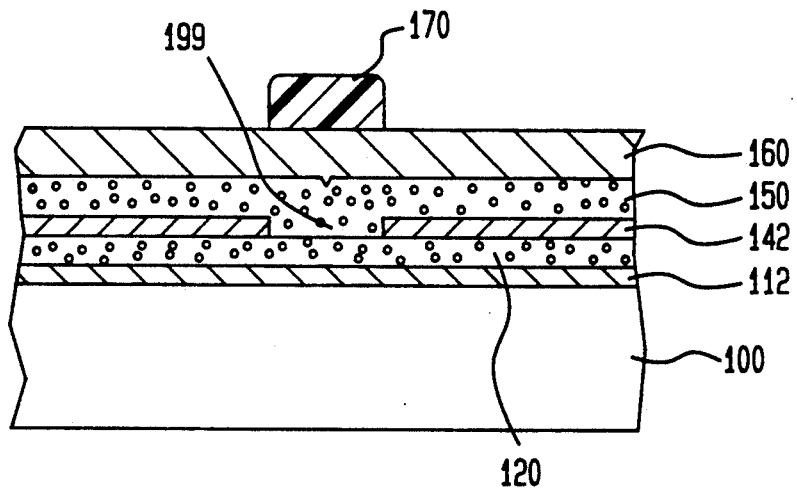

The CVD-silicon oxide film 142 was selectively etched using the resist pattern 144 as an etching mask to form an opening in the CVD-silicon oxide film 142. After removing the resist pattern 144, a poly-Si film (200 to 300 nm thick) 150 as a second conductive film and a silicon oxide film (about 200 nm thick) 160 were successively deposited over the CVD-silicon oxide film 142. As shown in FIG. 11B, the poly-Si film 150 contacted the poly-Si film 120 through the opening 199 of the CVD-silicon oxide film 142. In order to reduce a resistivity of the poly-Si films 120 and 150, diffusion of dopants into the poly-Si film 120 and 150 was conducted by the process as mentioned in Example 1.

A resist pattern 170 which defines the gate line region was formed on the silicon oxide film 160 so as to cover the opening 199 of the silicon oxide film 140 as shown FIG. 11B. Resist pattern 170, which is formed on the surface of the silicon oxide film 160 has a width which is wider than that of the opening 199 in the CVD-silicon oxide film 142. The resist pattern 170 had a width of 0.8 to 1.0 μm.

Using the resist pattern 170 as an etching mask, the silicon oxide film 160 was anisotropically etched by an RIE technique to form a silicon oxide film pattern 160A of wiring shape, and the poly-Si film 150 was anisotropically etched by an RIE technique to form a poly-Si film pattern 150A with a width which is wider than that of the opening 199 in the CVD-silicon oxide film 142 (which constitutes the upper portion of the gate line of the MOSFET). In the step of etching the poly-Si film 150, the CVD-silicon oxide film 142 functioned as an etching stopper, and it was possible to etch the poly-Si film 150 efficiently and easily.

Figure 11C:
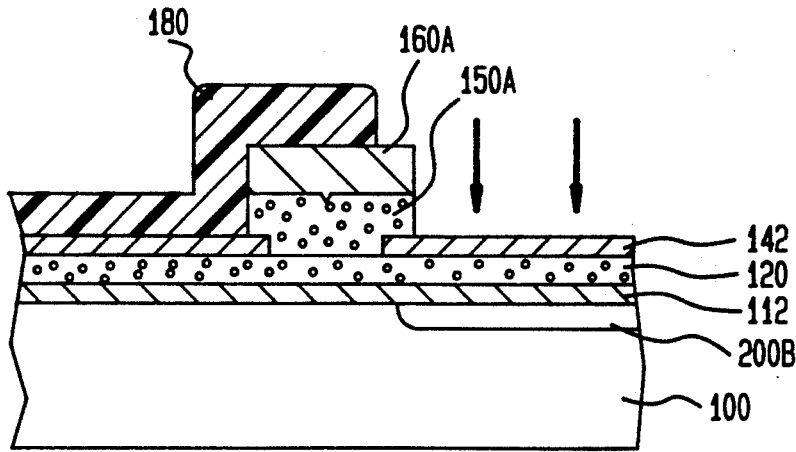

After removing the resist pattern 170, a resist pattern 180 was formed on the poly-Si film 142 to cover the region which is to become the source of the MOSFET. Using the resist pattern 180 and the poly-Si film pattern 150A as an implant mask, phosphorus ions were implanted at a low dose through the gate oxide layer 112, poly-Si film 120 and the CVD-silicon oxide film 142 to form a semiconductor region 200B of n-type in the p-type semiconductor layer 100 as shown in FIG. 11C.

Figure 11D:
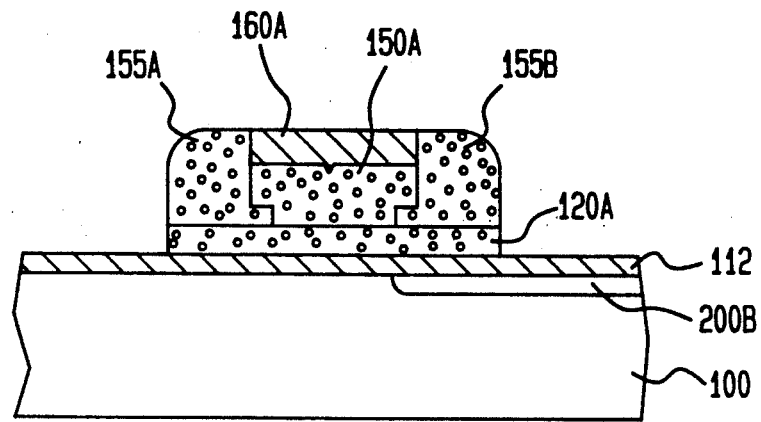

After removing the resist pattern 180, and removing the silicon oxide film 142 using an NH$_4$F solution, a poly-Si film as a third conductive film was deposited on the poly-Si film 120 to cover the upper portion of the gate line. Using an anisotropic RIE technique, the poly-Si film was etched back to expose the surface of the silicon oxide film 112. Poly-Si films (sidewall spacers) 155A and 155B were left on the side surfaces of the pattern 152A, as shown in FIG. 11D.

Figure 11E:
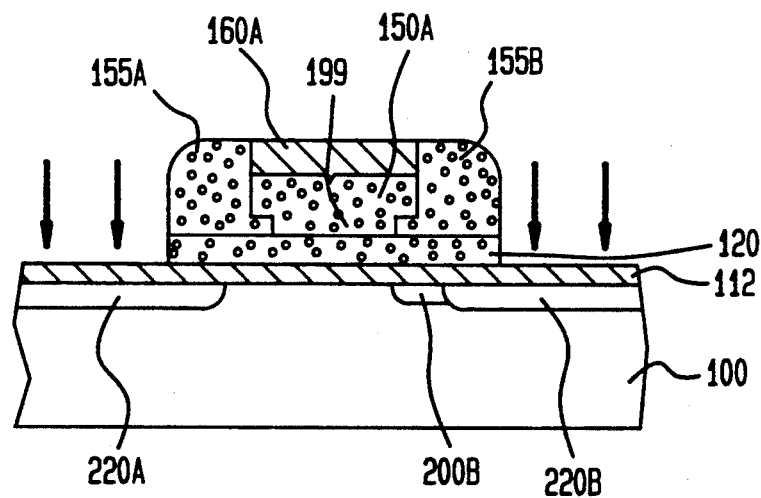
Figure 12A:
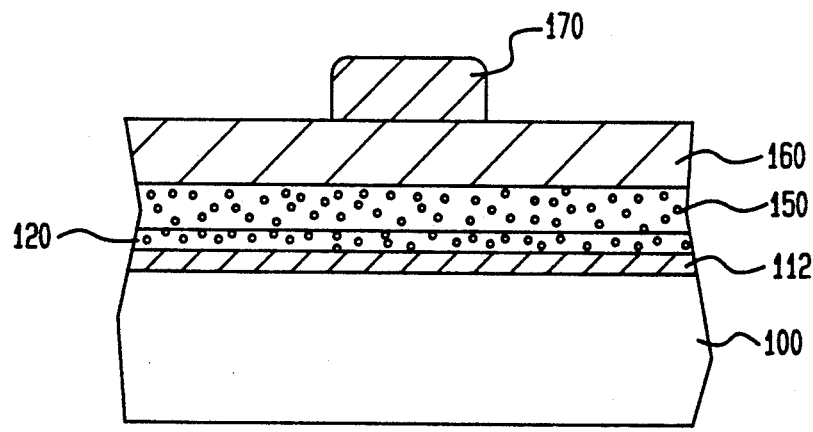
FIGS. 12A to 12D are cross sectional views illustrating the steps of fabricating an n-channel MOSFET according to a prior art.
Figure 12B:
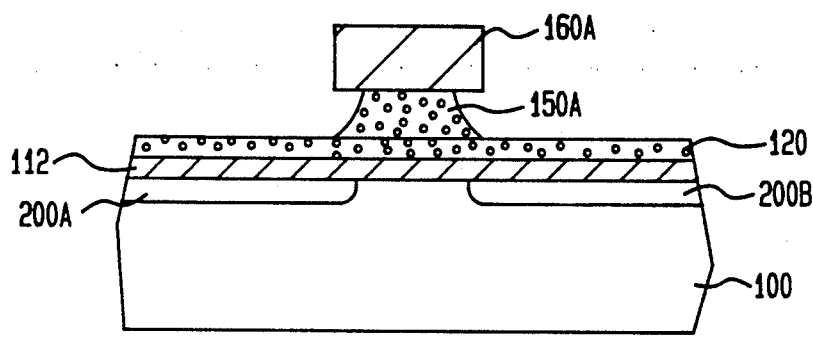
Figure 12C:
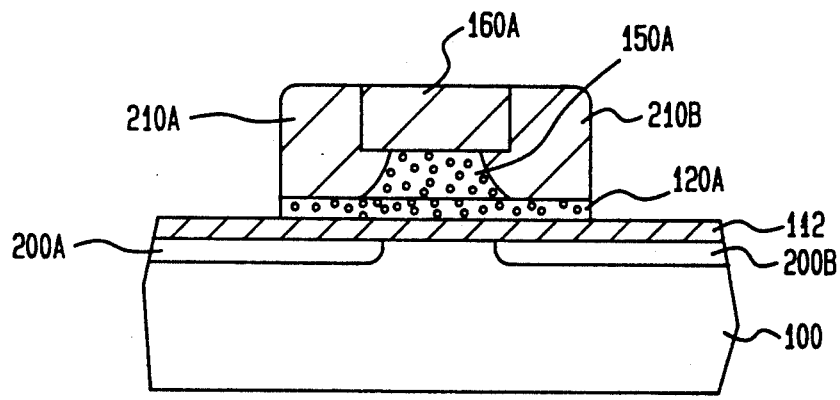
Figure 12D:
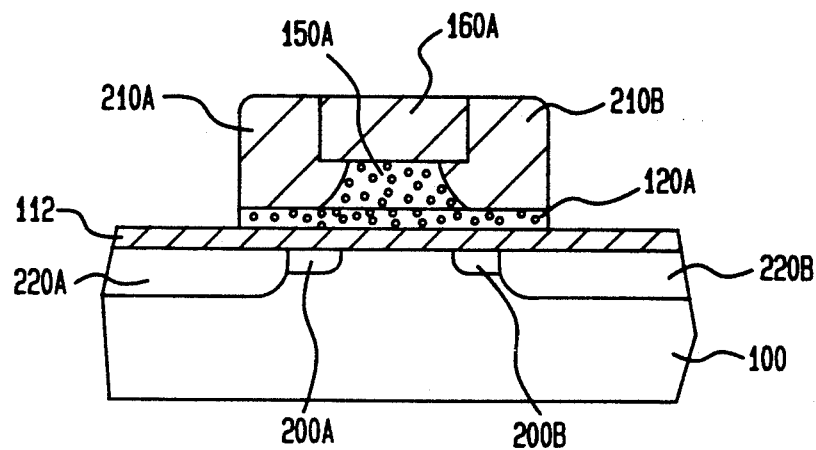

By the nearly vertical ion implantation method, arsenic ions were implanted into the semiconductor layer 100 at a dose of 2 to $9 \times 10^{15}$ cm$^{-2}$, using the poly-Si films 155A and 155B and poly-Si film 150A as an implant mask, thereby forming a third semiconductor region 220A of n$^+$-type and a fourth semiconductor region 220B of n$^+$-type as in the p-type semiconductor layer 100, as shown in FIG. 11E. The third semiconductor region 220A constitutes the source of the MOSFET. The second semiconductor region 200B and the fourth semiconductor region 220B constitute the drain of the MOSFET.

According to this embodiment, a lightly doped region was not formed in the end part of the source. Therefore, the resistance of the source was reduced and a MOSFET having a high driving ability was obtained. In addition, the conductive films (the poly-Si films 155A and 155B) were used as the sidewall spacers. Therefore, the gate line having lower resistance was obtained.

In this invention, a p-type silicon substrate or a p-type well (p-type tub) formed in an n-type silicon substrate may be used as the p-type semiconductor layer 100.

The opening 199 may be formed in any portion of the gate line region of the silicon oxide film 140. Specifically, the opening 199 may be formed in the gate electrode portion of the gate line region (over the channel region of the MOSFET), and/or in the filed portion of the gate line region (over the oxide layer 110). A gate line connecting a plurality of MOSFETs has at least one opening 199 for electrically connecting the second conductive film 150 (or 152) and the first conductive film 120.

In order to reduce the resistivity of the gate line, a conductive film made of a refractory metal (e.g. tungsten, or titanium silicide) or a refractory metal silicide (e.g. tungsten silicide) may be used as the buffer film or/and the sidewall spacers.

The formation of the silicon oxide film 160A may be omitted. If the formation is omitted, during ion implantation, ions may penetrate into the semiconductor layer 100 through the second conductive film 150 (or 152) due to the channeling effects. Therefore, it is preferable to form the silicon oxide film pattern 160A on the second conductive film 150 (or 152).

In order to form the first and second semiconductor regions 200A and 200B, ions may be implanted into the semiconductor layer 100 after removing the buffer film 140.

The lightly doped semiconductor region 200D at the end part of the drain reduces the peak electric field at the end part of the drain. If the first semiconductor region 200A and the second semiconductor region 200B were formed as heavily doped regions, the step of forming the third semiconductor region 220A and the fourth semiconductor region 220B may be omitted.

The step of implanting ions of a second conductivity type into the semiconductor layer 100 using the upper portions of the gate line and the sidewall spacers as an implant mask to reduce the resistance of said sources and drains may be conducted before the step of etching the buffer film.

The threshold-adjust implant (channel doping) for controlling the threshold voltage of the MOSFET may be employed if necessary.

While the invention has been described in conjunction with the n-channel MOSFETs, the invention is applicable to p-channel MOSFETs and CMOS devices.

Thus, according to the method of the invention, the buffer film which is interposed between the second conductive film and the first conductive film is used as an etch stop in the step of etching the second conductive film, and a good electrical interconnection between the second conductive film and the first conductive film is achieved through the openings of the buffer film. The buffer film can be sufficiently thick enough to serve as an etch stop for a low selective etching, so that etching of the second conductive film can be conducted with ease even under the anisotropic dry etching conditions. Therefore, an excellent shape of a gate line (or a gate electrode) having a gate-drain overlap structure is obtained.

In addition, due to the buffer film which is interposed between the second conductive film and the first conductive film, many kinds of materials having a low resistivity (e.g., refractory metals or refractory metal silicides) can be used as a material of the gate line to reduce the resistance of the gate line. And the second conductive films made of these materials also can be isotropically etched to form the gate lines having a good shape.

According to the invention, the overlapped region between the gate line and the drain can be formed by an ion implantation method using the buffer film as a channeling stop film to prevent the channeling effect of ions. Therefore, variations in the length of the overlap between the gate line and the drain are reduced so that variations in the length of the channel of the MOSFET can be reduced.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of fabricating a semiconductor device having MOSFETs, comprising the steps of:
   forming an insulating film as a gate insulator on a semiconductor layer of a first conductivity type;
   forming a first conductive film on said insulating film;
   forming a buffer film on said first conductive film, said buffer film having openings in gate line regions of said buffer film;
   forming a second conductive film on said buffer film;
   etching said second conductive film into wiring shape to form upper portions of gate lines of said MOSFETs, said upper portions covering said openings of said buffer film functioned as an etch stop and having a width which is wider than that of said openings;
   implanting ions of a second conductivity type into said semiconductor layer using said paper portions of said gate lines as an implant mask to form sources and drains in said semiconductor layer;
   forming sidewall spacers on the sides of said upper portions of said gate lines;
   etching said buffer film using said upper portions of said gate lines and said sidewall spacers as an etching mask; and
   etching said first conductive film using said upper portions of said gate lines and said side spacers as an etching mask, thereby forming under portions of said gate lines.

2. A method according to claim 1, wherein said first conductive film is made of semiconductor and said steps of forming said buffer film on said conductive film comprises the steps of:
   forming an oxidation resistant layer which defines the surface locations of said openings on said first conductive film;
   oxidizing selectively exposed surface of said first conductive film, using said oxidation resistant layer as a mask, to form said buffer film, said buffer film being made of semiconductor oxide; and removing said oxidation resist layer to form said openings in said buffer film.

3. A method according to claim 1, wherein said second conductive film is made of material selected from the group consisting of metal and metal compound.

4. A method according to claim 1, said method further comprises the step of:
   implanting ions of a second conductivity type into said semiconductor layer using said upper portions of said gate lines and said sidewall spacers as an implant mask to reduce the resistance of said sources and drains.

5. A method according to claim 1, wherein said first conductive film is made of semiconductor and said method further comprises the steps of:
   diffusing dopants into said second conductive film; and
   diffusing said dopants into said first conductive film from said second conductive film through said openings of said buffer film to reduce conductivity of said first conductive film.

6. A method according to claim 1, wherein said buffer film is made of conductive material.

7. A method according to claim 1, wherein said sidewall spacers are made of conductive material.

8. A method according to claim 1, wherein said openings of said buffer film are formed just above channel regions of said MOSFETs.

9. A method according to claim 1, wherein said step of implanting said ions of a second conductivity type into said semiconductor layer comprises a step of implanting said ions into said semiconductor layer using an oblique ion implantation method.

10. A method of fabricating a semiconductor device having MOSFETs, comprising the steps of:
    forming an insulating film as a gate insulator on a semiconductor layer of a first conductivity type;
    forming a first conductive film on said insulating film;
    forming a buffer film on said first conductive film, said buffer film having openings in gate line regions of said buffer film;
    forming a second conductive film on said buffer film;
    etching said second conductive film into wiring shapes to form upper portions of gate lines of said MOSFETs, said upper portions covering said openings of said buffer film functioned as an etch stop and having a width which is wider than that of said openings;
    forming on said buffer layer an implant mask layer to cover source regions of said semiconductor layer;
    implanting ions of a second conductivity type into said semiconductor layer using said upper portions of said gate lines and said mask layer as an implant mask to form drains in said semiconductor layer;
    removing said mask layer from said buffer layer;
    forming sidewall spacers on the sides of said upper portions of said gate lines; and
    etching said buffer film using said upper portions of said gate lines and said sidewall spacers as an etching mask;
    etching said first conductive film using said upper portions of said gate lines and said sidewall spacers as an etching mask, thereby forming under portions of said gate lines; and
    implanting ions of a second conductivity type semiconductor layer using said upper portions of said gate lines and said sidewall spacers as an implant mask to form sources in said semiconductor layer and to reduce the resistance of said drains.

11. A method of fabricating a semiconductor device having MOSFETs, comprising the steps of:
    forming an insulating film on a semiconductor layer of a first conductivity type;
    forming a first conductive film on said insulating film;
    forming a buffer film on said first conductive film, said buffer film having openings in gate line regions of said buffer film;
    forming a second conductive film on said buffer film;
    etching said second conductive film into wiring shape to form upper portions of said gate lines, said upper portions covering said openings of said buffer film functioned as an etch stop and having a width which is wider than that of said openings;
    implanting ions of a second conductivity type into said semiconductor layer using said upper portions of said gate lines as an implant mask to form sources and drains in said semiconductor layer, said ions are implanted into said semiconductor layer in an oblique direction;
    etching said buffer film using said upper portions of said gate lines as an etching mask; and
    etching said first conductive film using said upper portions of said gate lines as an etching mask, thereby forming under portions of said gate lines.

12. A method according to claim 11, wherein said first conductive film is made of semiconductor and said steps of forming said buffer film on said conductive film comprises the steps of:
    forming an oxidation resistant layer which defines the surface locations of said openings on said first conductive film;
    oxidizing selectively exposed surface of said first conductive film, using said oxidation resistant layer as a mask, to form said buffer film, said buffer film being made of semiconductor oxide; and
    removing said oxidation resist layer to form said openings in said buffer film.

13. A method according to claim 11, wherein said second conductive film is made of material selected from the group consisting of metal and metal compounds.

14. A method according to claim 11, said method further comprises the step of:
    implanting ions of a second conductivity type into said semiconductor layer using said upper portions of said gate lines as an implant mask to reduce a resistance of said sources and drains.

15. A method according to claim 11, wherein said first conductive film is made of semiconductor and said method further comprises the steps of:
    diffusing dopants into said second conductive film; and
    diffusing said dopants into said first conductive film from said second conductive film through said openings of said buffer film to reduce conductivity of said first conductive film.

16. A method according to claim 11, wherein said buffer film are made of conductive material.

17. A method according to claim 11, wherein said openings of said buffer film are formed just above channel regions of said MOSFETs.

18. A method of fabricating a semiconductor device having MOSFETs, comprising the steps of:
    forming an insulating film on a semiconductor layer of a first conductivity type;

forming a first conductive film on said insulating film;

forming a buffer film on said first conductive film, said buffer film having openings in gate line regions of said buffer film;

forming a second conductive film on said buffer film;

etching said second conductive film into wiring shapes to form upper portions of said gate lines, said upper portions covering said openings of said buffer film functioned as an etch stop and having a width which is wider than that of said openings;

implanting ions of a second conductivity type into said semiconductor layer using said upper portions of said gate lines as an implant mask to form sources and drains in said semiconductor layer;

removing said buffer film from said first conductive film;

forming sidewall spacers on the sides of said upper portions of said gate lines; and etching said first conductive film using said upper portions of said gate lines and said side spacers as an etching mask, thereby forming under portions of said gate lines.

19. A method according to claim 18, wherein said first conductive film is made of semiconductor and said steps of forming said buffer film on said conductive film comprises the steps of:

forming an oxidation resistant layer which defines the surface locations of said openings on said first conductive film;

oxidizing selectively exposed surface of said first conductive film, using said oxidation resistant layer as a mask, to form said buffer film, said buffer film being made of semiconductor oxide; and removing said oxidation resist layer to form said openings in said buffer film.

20. A method according to claim 18, wherein said second conductive film are made of material selected from the group consisting of metal and metal compound.

21. A method according to claim 18, said method further comprising the step of:

implanting ions of a second conductivity type into said semiconductor layer using said upper portions of said gate lines and said sidewall spacers as an implant mask to reduce the resistance of said sources and drains.

22. A method according to claim 18, wherein said first conductive film is made of semiconductor and said method further comprises the steps of:

diffusing dopants into said second conductive film; and diffusing said dopants into said first conductive film from said second conductive film through said openings of said buffer film to reduce conductivity of said first conductive film.

23. A method according to claim 18, wherein said sidewall spacers are made of conductive material.

24. A method according to claim 18, wherein said openings of said buffer film are formed just above channel regions of said MOSFETs.

25. A method according to claim 18, wherein said step of implanting ions of a second conductivity type into said semiconductor layer comprises a step of implanting said ions into said semiconductor layer using an oblique ion implantation method.

* * * * *

UNITED STATES PATENT AND TRADEMARK OFFICE
CERTIFICATE OF CORRECTION

PATENT NO. : 5,202,277
DATED : April 13, 1993
INVENTOR(S) : S. Kameyama et al.

It is certified that error appears in the above-indentified patent and that said Letters Patent is hereby corrected as shown below:

Column 24, line 46, change "paper" to -- upper --.

Signed and Sealed this

Fourth Day of January, 1994

Attest:

BRUCE LEHMAN

Attesting Officer

Commissioner of Patents and Trademarks